US008289771B2

(12) United States Patent
Tseng et al.

(10) Patent No.: US 8,289,771 B2
(45) Date of Patent: Oct. 16, 2012

(54) DATA READING METHOD AND CONTROL CIRCUIT AND MEMORY CONTROLLER USING THE SAME

(75) Inventors: Chien-Fu Tseng, Yunlin County (TW); Kuo-Hsin Lai, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 270 days.

(21) Appl. No.: 12/861,089

(22) Filed: Aug. 23, 2010

(65) Prior Publication Data
US 2011/0317488 A1   Dec. 29, 2011

(30) Foreign Application Priority Data
Jun. 23, 2010   (TW) .............................. 99120456 A

(51) Int. Cl.
*G11C 11/34* (2006.01)
*G11C 16/06* (2006.01)
(52) U.S. Cl. .......... 365/185.09; 365/185.02; 365/185.18
(58) Field of Classification Search ............. 365/185.09, 365/185.18, 185.05, 185.02, 185.33
See application file for complete search history.

(56) References Cited

U.S. PATENT DOCUMENTS
2008/0123408 A1   5/2008   Honma et al.
2009/0234792 A1*  9/2009   Kim et al. .................... 706/50
* cited by examiner

*Primary Examiner* — Alexander Sofocleous
*Assistant Examiner* — Hien Nguyen
(74) *Attorney, Agent, or Firm* — J.C. Patents

(57) ABSTRACT

A data reading method for a flash memory module is provided. The method includes applying a bit-data-read voltage to get read data from memory cells of the flash memory module. The method also includes setting a minus-adjustment-bit-data-read voltage and a plus-adjustment-bit-data-read voltage corresponding to the bit-data-read voltage based on an error-distribution estimated value and applying the minus-adjustment-bit-data-read voltage and the plus-adjustment-bit-data-read voltage to obtain soft values corresponding to the read data from the memory cells. The method further includes calculating a soft-information estimated value corresponding to each bit of the read data according to the soft-values. Accordingly, the method can effectively obtain soft information.

25 Claims, 15 Drawing Sheets

DATA READING METHOD AND CONTROL CIRCUIT AND MEMORY CONTROLLER USING THE SAME

CROSS-REFERENCE TO RELATED APPLICATION

This application claims the priority benefit of Taiwan application serial no. 99120456, filed on Jun. 23, 2010. The entirety of the above-mentioned patent application is hereby incorporated by reference herein and made a part of specification.

BACKGROUND

1. Technology Field

The present invention generally relates to a flash memory storage system, and more particularly to a data reading method for a flash memory, and a control circuit using the same.

2. Description of Related Art

The growth of digital cameras, camera mobile phones, and MP3 players has been rapid in recent years. Consequently, demands of consumers for storage media of digital contents have increased tremendously. Since a flash memory has a characteristics of non-volatile data, energy saving, compact size, and without mechanical construction, the flash memory is suitable for users to carry on bodies as the storage media for transferring and exchanging the digital contents. Solid State Drive (SSD) is an example of utilizing the flash memory as the storage media, and has been widely applied in the computer host as a main hard disk.

A flash memory may be classified into a NOR flash memory or a NAND flash memory. Additionally, a NAND flash memory may be classified into a Single Level Cell (SLC) NAND flash memory or a Multi Level Cell (MLC) NAND flash memory according to the number of bits which each memory cell thereof is capable of storing. Each memory cell can store one bit of data in a SLC NAND flash memory, and each memory cell can store at least two bits of data in a MLC NAND flash memory. For example, taking a 4 level cell NAND flash memory as an example, each memory cell may store 2 bits of data (i.e., "11", "10", "00" or "01").

In a flash memory, memory cells are linked through bit lines and word lines to form a memory cell array. When a control circuit for controlling these bit and word lines reads/writes data from/to an assigned memory cell, float voltages of other memory cells may be disturbed, and thus error bits may occur (i.e., data (also referred to as "read data") read from a memory cell by the control circuit is different from data (also referred to as "write data") originally written into the memory cell). Or, when the flash memory is worn due to some factors (such as, unused for long-teen, leakage of electricity or frequently erased), float voltages of memory cells may change and thus error bits may occur.

In general, an error checking and correcting circuit is configured in a flash memory apparatus for generating an error checking and correcting (ECC) code for data to be written and performing an ECC procedure for data to be read, thereby correcting error bits. Because of manufacturing processes of flash memory or a hardware framework of flash memory, each memory cell can store more and more bits of data and thus the number of error bits occurred in a MLC NAND flash memory may be more than that in a SLC NAND flash memory. Therefore, an error correcting technique capable of correcting more error bits is needed for the MLC NAND flash memory, such as the Low Density Parity Check (LDPC) technique, the Turbo Code technique, and so on. For example, when the LDPC technique or the Turbo Code technique is applied, a memory storage apparatus may obtain soft information from memory cells to try correct more error bits by the LDPC technique or the Turbo Code technique. However, reading soft information will increase greatly the time for executing a read command. For example, according to the disclosure in U.S. patent application NO. 2008/0123408, taking a 4 level cell flash memory as an example, reading data from a upper page and a lower page needs 3 steps, and reading data and soft information from a upper page and a lower page needs 15 steps. Therefore, how to increase the efficiency of reading soft information from memory cells is one of the major subjects in the industry.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention provides a data reading method capable of effectively reading soft values from memory cells to obtain soft information thereof.

The present invention provides a control circuit capable of effectively reading soft values from memory cells to obtain soft information thereof.

The present invention provides a memory controller capable of effectively reading soft values from memory cells to obtain soft information thereof.

According to an exemplary embodiment of the present invention, a data reading method for a flash memory module is provided. The data reading method includes applying a bit-data-read voltage to get read data from a plurality of memory cells of the flash memory module, wherein the read data has a plurality of bits. The data reading method also includes setting a minus-adjustment-bit-data-read voltage and a plus-adjustment-bit-data-read voltage corresponding the bit-data-read voltage according to an error-distribution estimated value, and applying the minus-adjustment-bit-data-read voltage and the plus-adjustment-bit-data-read voltage to obtain a plurality of soft values corresponding to the read data from the memory cells. The data reading method further includes calculating a soft-information estimated value corresponding to each bit of the read data according to the soft values.

According to an exemplary embodiment of the present invention, a control circuit is provided. The control circuit includes a memory unit and a soft value extracting circuit. The memory unit is configured for recording a bit-data-read voltage. The soft value extracting circuit is coupled to the memory unit and configured for applying a bit-data-read voltage to get read data from a plurality of memory cells, wherein the read data has a plurality of bits. Additionally, the soft value extracting circuit is further configured for setting a minus-adjustment-bit-data-read voltage and a plus-adjustment-bit-data-read voltage corresponding to the bit-data-read voltage according to an error-distribution estimated value, and applying the minus-adjustment-bit-data-read voltage and the plus-adjustment-bit-data-read voltage to obtain a plurality of soft values corresponding to the read data from the memory cells. Moreover, the soft value extracting circuit is further configured for calculating a soft-information estimated value corresponding to each bit of the read data according to the soft values.

According to an exemplary embodiment of the present invention, a memory controller is provided. This memory controller includes a memory interface, a host interface and a memory management circuit. The memory interface is configured to couple to a flash memory module. The host interface is configured to couple to a host system. The memory management circuit is coupled to the memory interface and the host interface. The memory management circuit is configured for receiving a read command from the host system and obtaining read data corresponding to the read command from a plurality of memory cells of the flash memory module via the memory interface, wherein the read data has a plurality of bits. Here, the memory management circuit includes a memory unit and a soft value extracting circuit. The memory unit is configured for recording a bit-data-read voltage. The soft value extracting circuit is coupled to the memory unit and configured for setting a minus-adjustment-bit-data-read voltage and a plus-adjustment-bit-data-read voltage corresponding to the bit-data-read voltage according to an error-distribution estimated value. Additionally, the soft value extracting circuit gives a soft-information estimated value request command to the flash memory module to instruct the flash memory module to apply the minus-adjustment-bit-data-read voltage and the plus-adjustment-bit-data-read voltage for obtaining a plurality of soft values corresponding to the read data from the memory cells. Moreover, the soft value extracting circuit is further configured for calculating a soft-information estimated value corresponding to each bit of the read data according to the soft values.

Based on the above, the data reading method, the control circuit and the memory controller of the present exemplary embodiment may obtain the soft-information estimated value based on the error-distribution estimated value, thereby effectively shortening the time for reading soft information.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
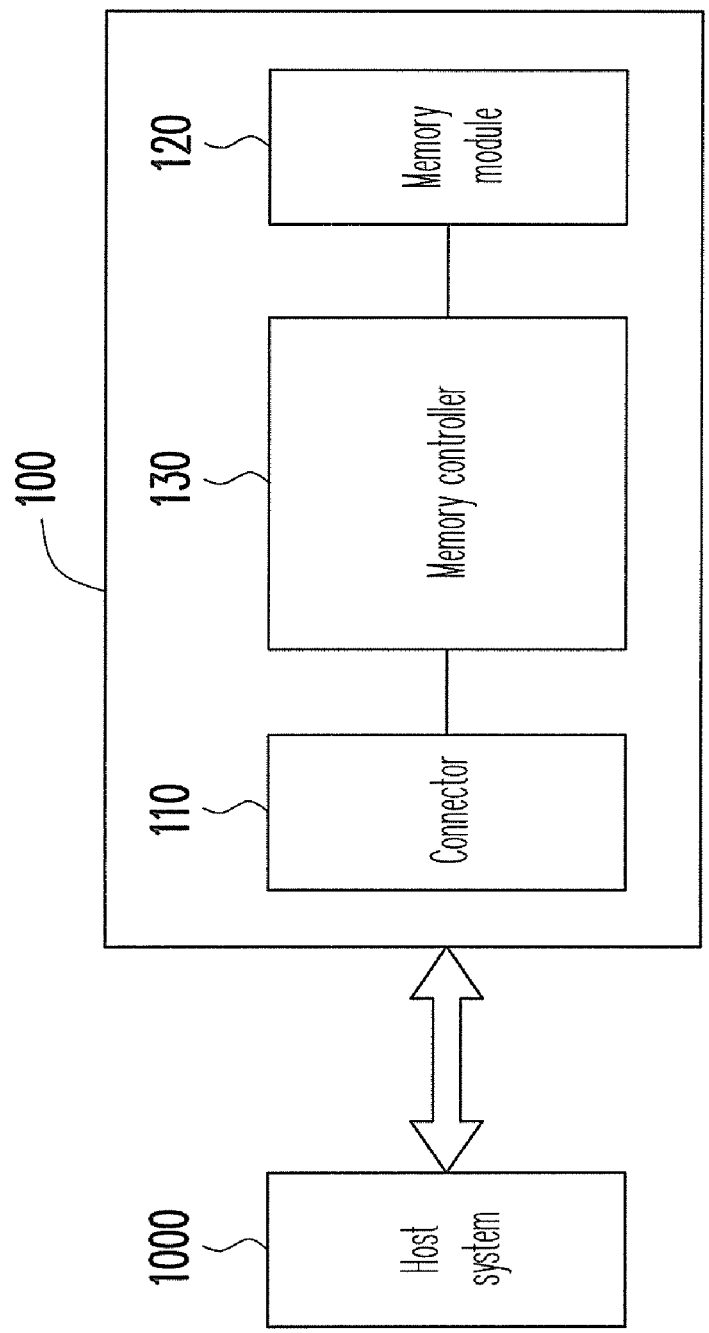
FIG. 1 is a schematic block diagram illustrating a memory storage apparatus according to a first exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In the invention, when a memory storage system applies a bit-data-read voltage to read data from a flash memory module, a data reading method according to the invention sets a minus-adjustment-bit-data-read voltage and a plus-adjustment-bit-data-read voltage corresponding to the bit-data-read voltage according to an error-distribution estimated value, and applies the minus-adjustment-bit-data-read voltage and the plus-adjustment-bit-data-read voltage to obtain soft values corresponding to the read data from the memory cells, thereby calculating soft-information estimated values corresponding the data. That is, the data reading method according to the invention only reads soft values that are more important for an error checking and correcting (ECC) procedure, thereby effectively shortening the time for extracting soft information. Several exemplary embodiments of the present invention will be described in details in the following with reference to accompany the drawings.

First Exemplary Embodiment

FIG. 1 is a schematic block diagram illustrating a memory storage apparatus according to a first exemplary embodiment of the present invention.

Referring to FIG. 1, a flash memory storage apparatus 100 is usually used together with a host system 1000. The host system 1000 may write data into the flash memory storage apparatus 100 or read data from the flash memory storage apparatus 100.

The memory storage apparatus 100 includes a connector 110, a memory module 120, and a memory controller 130.

In the first exemplary embodiment, the connector 110 is a universal serial bus (USB) connector. However, it should be noticed that the present invention is not limited thereto and the connector 110 also can be an institute-of-electrical-and-electronic-engineers (IEEE) 1394 connector, a peripheral-component Interconnect-express (PCI Express) connector, a serial advanced technology attachment (SATA) connector, a secure digital (SD) interface connector, a memory stick (MS) interface connector, a multi-media-card (MMC) interface connector, a compact flash (CF) interface connector, an integrated-device-electronics (IDE) connector or other suitable type of connectors.

The memory module 120 is configured for storing data written by the host system 1000. In the first exemplary embodiment, the memory module 120 is a multi-level cell (MLC) NAND flash memory module. However, the present invention is not limited thereto, and in another embodiment of the present invention, the memory module 120 may also be a single level cell (SLC) NAND flash memory.

The memory controller 130 is coupled to the connector 110 and the memory module 120. The memory controller 130 executes a plurality of logic gates or control instructions implemented in a hardware foam or a firmware form and performs various operations in the memory module 120 according to commands of the host system 1000, such as data writing, reading, and erasing. In particular, the memory controller 130 is configured for executing a data reading method according to the first exemplary embodiment.

Figure 2:
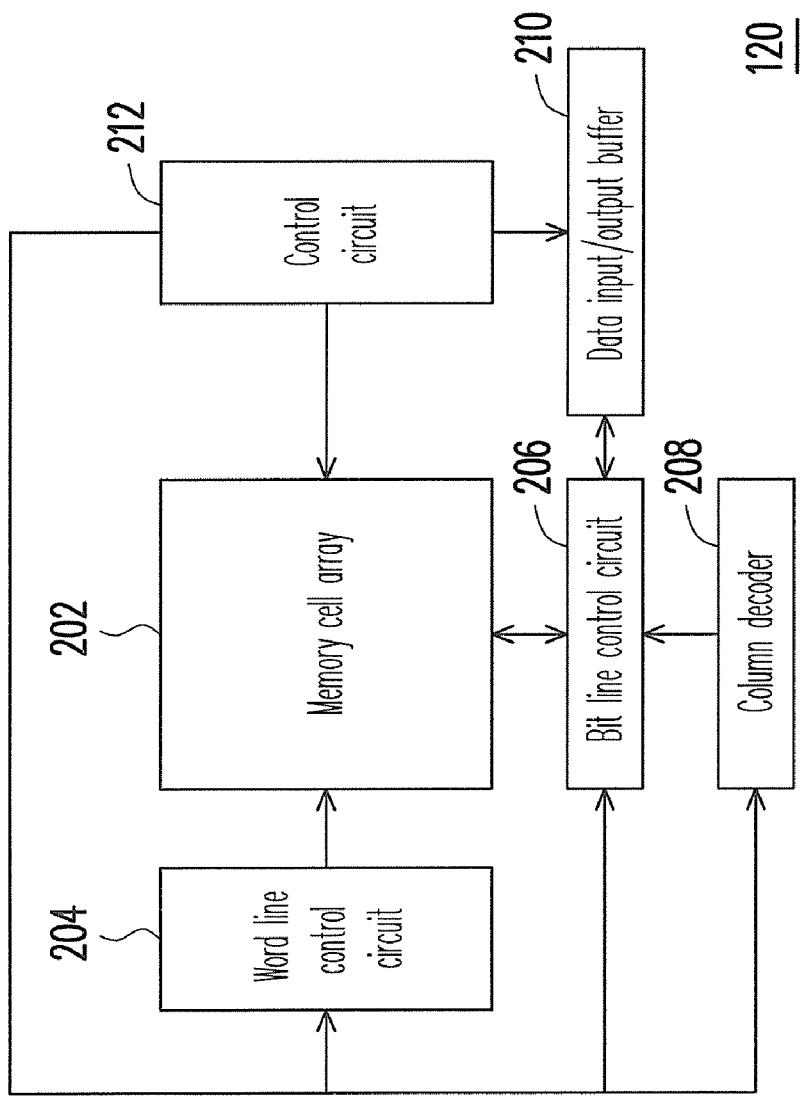
FIG. 2 is a schematic block diagram illustrating a memory module according to the first exemplary embodiment of the present invention.

FIG. 2 is a schematic block diagram illustrating a memory module according to the first exemplary embodiment of the present invention.

The memory module 120 includes a memory cell array 202, a word line control circuit 204, a bit line control circuit 206, a column decoder 208, a data input/output buffer 210 and a control circuit 212.

The memory cell array 202 includes a plurality of memory cells (not shown) for storing data, and a plurality of bit lines, a plurality of word lines and a common source line (not shown) connected with these memory cells. The memory cells are disposed at intersections formed by the bit lines and the word lines in an array form. When receiving a write command or a read command from the memory controller 130, the control circuit 212 controls the word line control circuit 204, the bit line control circuit 206, the column decoder 208 and the data input/output buffer 210 to write data into the memory array 202 or read data from the memory array 202, wherein the word line control circuit 204 is configured for controlling word line voltages applied to the word lines, the bit line control circuit 206 is configured for controlling the bit lines, the column decoder 208 is configured for decoding a column address to select a corresponding bit line according to the write command or read command, and the data input/output buffer 210 is configured for temporarily storing data.

As described above, in the exemplary embodiment, the memory module 120 is a MLC NAND flash memory module and different float voltages are used for representing multi-bits of data. To be specific, each memory cell in the memory array 202 has a plurality of storage states and these storage states are distinguished by a plurality of bit-data-read voltages.

Figure 3:
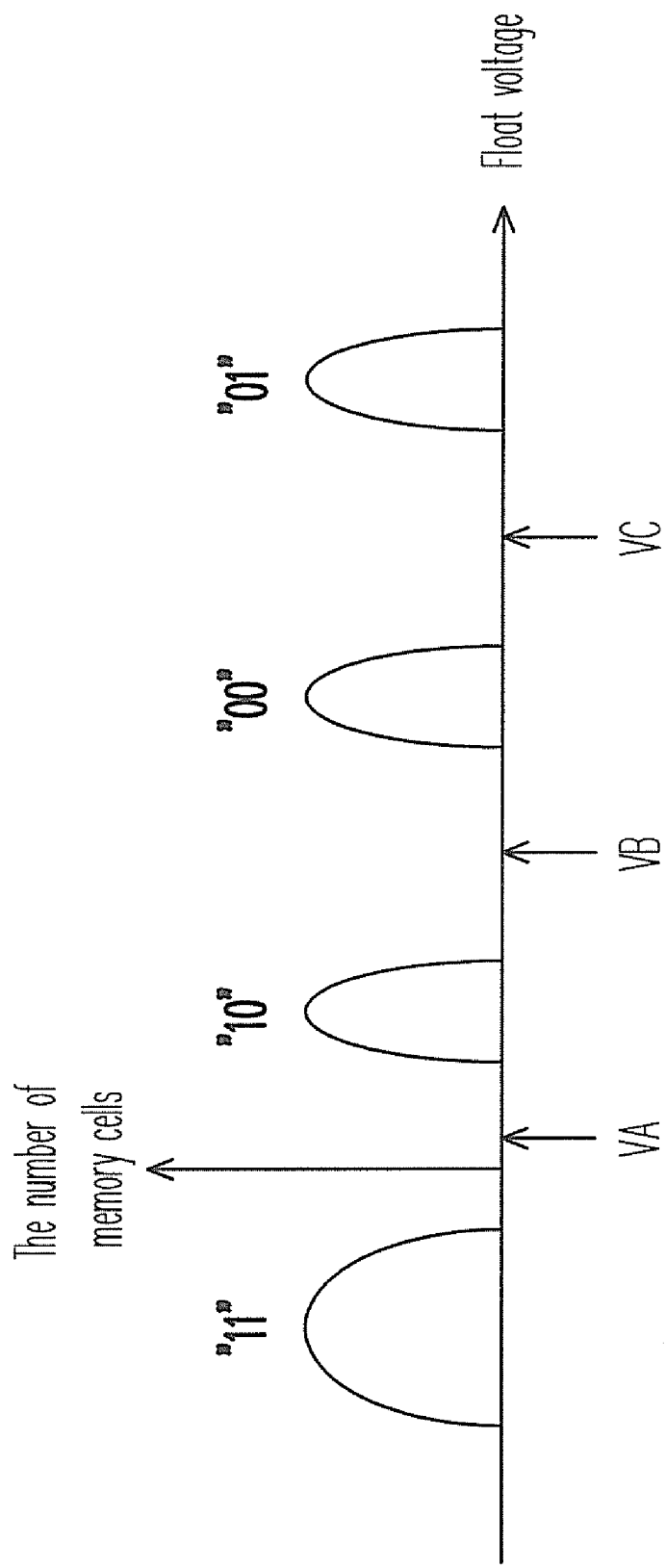
FIG. 3 is a statistical distribution diagram of float voltages corresponding to data stored in a memory array according to the first exemplary embodiment of the present invention.

FIG. 3 is a statistical distribution diagram of float voltages corresponding to data stored in a memory array according to the first exemplary embodiment of the present invention.

Referring FIG. 3, a float voltage of each memory cell is identified into one of 4 storage states according to a first-bit-data-read voltage VA, a second-bit-data-read voltage VB, and a third-bit-data-read voltage VC, wherein the 4 storage states respectively represent "11", "10", "00" and "01". In other words, each of the storage states includes a least significant bit (LSB) and a most significant bit (MSB). In the present exemplary embodiment, the first bit from the left of the storage state is the LSB and the second bit from the left of the storage state is the MSB. Therefore, in the first exemplary embodiment, one cell may store 2 bits of data. It should be noted that in FIG. 3, the corresponding relationship between the float voltages and the storage states just is an example. In another exemplary embodiment, the corresponding relationship between the float voltages and the storage states may be "11", "10", "01" and "00" from the left to the right along with the X axle. Or, the storage states corresponding to the float voltages may be values gotten by mapping or inverting actual storage values. Additionally, in another exemplary embodiment, the first bit from the left of the storage state may be the MSB and the second bit from the left of the storage state may be the LSB.

In the first exemplary embodiment, one memory cell can store 2 bits of data, therefore the memory cells at the same bit line can provides two pages (i.e., a lower page and an upper page) of storage space. That is, the LSB of each memory cell corresponds to a lower page and the MSB of each memory cell corresponds to an upper page. Herein, data belonging to the lower page is referred to as "lower page data" and data belonging to the upper page is referred to as "upper page data" in each memory cell. Additionally, one physical block is composed of several pages and each physical block is the smallest unit for erasing data. Namely, each physical block contains the least number of memory cells that are erased together.

A program (i.e., writing data) of a memory cell in the memory cell array 202 is performed by applying a voltage into the memory cell to change the float voltage of the memory cell, and thereby the memory will represents different storage states. For example, when the lower page data is about to be "1" and the upper page data to is about to be "1" in the memory cell, the control circuit 212 controls the word line control circuit 204 not to change the float voltage at the memory cell, and thus the storage state of the memory cell is kept as "11". When the lower page data is about to be "1" and the upper page data is about to be "0" in the memory cell, the word line control circuit 204 changes the float voltage at the memory cell under the control of the control circuit 212, and thus the storage state of the memory cell is become as "10". When the lower page data is about to be "0" and the upper page data is about to be "0" in the memory cell, the word line control circuit 204 changes the float voltage at the memory cell under the control of the control circuit 212, and thus the storage state of the memory cell is become as "00". And, when the lower page data is about to be "0" and the upper page data is about to be "1" in the memory cell, the word line control circuit 204 changes the float voltage at the memory cell under the control of the control circuit 212, and thus the storage state of the memory cell is become as "01".

Figure 4:
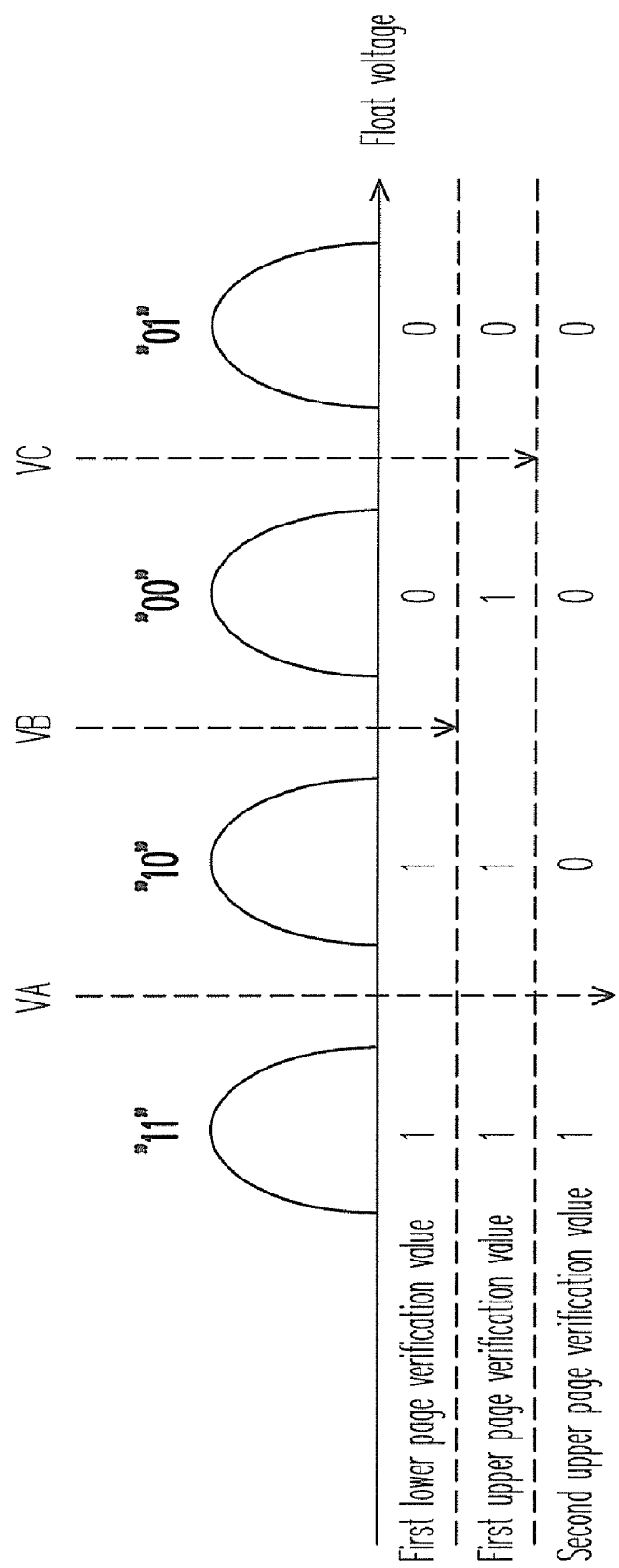
FIG. 4 is a diagram of reading data from one memory cell according to the first exemplary embodiment of the present invention.
Figure 5:
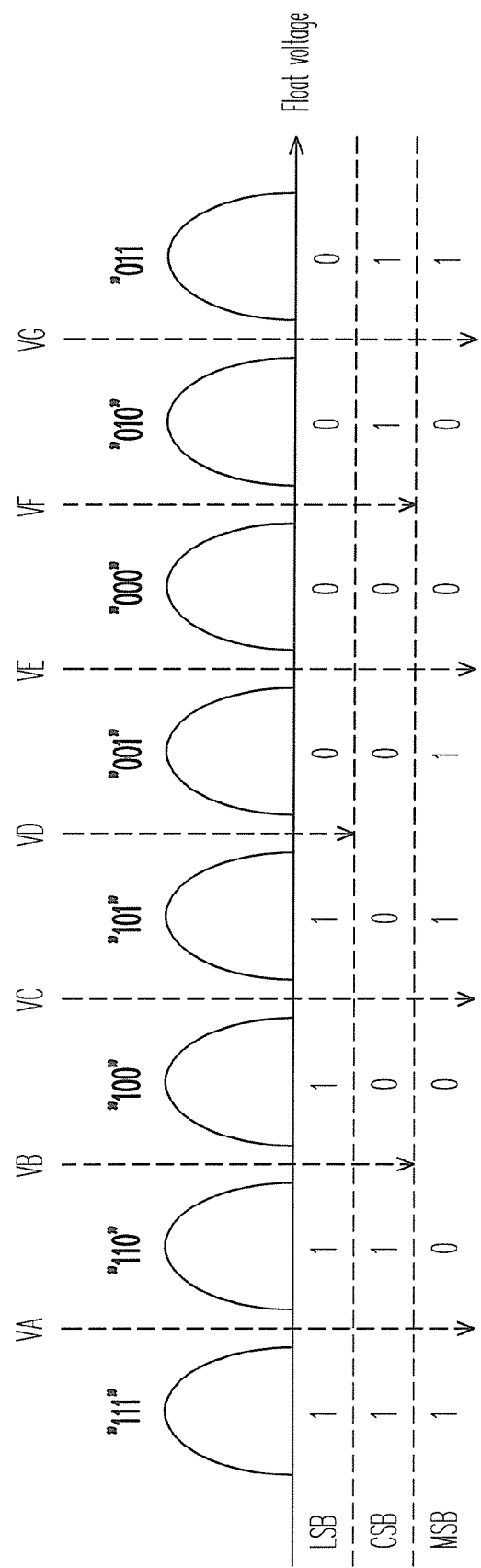
FIG. 5 is a diagram of reading data from one memory cell in an 8 level cell NAND flash memory according to another exemplary embodiment of the present invention.

FIG. 4 is a diagram of reading data from one memory cell according to the first exemplary embodiment of the present invention.

Referring to FIG. 4, in the operation of reading data from a memory cell in the memory array 202, bit-data-read voltages are used for identifying the float voltage of the memory cell. In the operation of reading lower page data in a memory cell, the word line control circuit 204 applies a second-bit-data-read voltage VB to the memory cell and identifies the lower page data according to the control gate of the memory cell and a formula (1):

$$LSB=(VB)Lower\_pre1 \quad (1)$$

Wherein (VB)Lower_pre1 represents a first lower page verification value obtained by applying the second-bit-data-read voltage VB.

For example, when the second data read voltage VB is smaller than the float voltage of a memory cell, the control gate of the memory cell is not turned on and thus outputs the first lower page verification value that is "0". Therefore, the LSB of the memory cell is identified as "0". For example, when the second data read voltage VB is larger than the float voltage of a memory cell, the control gate of the memory cell is turned on and thus outputs the first lower page verification value that is "1". Therefore, the LSB of the memory cell is identified as "1". That is, the float values representing that the LSB is "1" and the float values representing that the LSB is "0" can be discriminated by applying the second data read voltage VB.

In the operation of reading upper page data in a memory cell, the word line control circuit 204 respectively applies a third-bit-data-read voltage VC and a first-bit-data-read voltage VA to the memory cell and identifies the upper page data according to the control gate of the memory cell and a formula (2):

$$MSB=((VA)Upper\_pre2)xor(\sim(VC)Upper\_pre1) \quad (2)$$

wherein (VC)Upper_pre1 represents a first upper page verification value obtained by applying the third-bit-data-read voltage VC and (VA)Upper_pre2 represents a second upper page verification value obtained by applying the first-bit-data-read voltage VA, wherein the symbol '~' represents an invert. Additionally, in the exemplary embodiment, when the third-bit-data-read voltage VC is smaller than the float voltage of a memory cell, the control gate of the memory cell is not turned on and outputs the first upper page verification value that is "0"; and when the first-bit-data-read voltage VA is smaller than the float voltage of the memory cell, the control gate of the memory cell is not turned on and outputs the second upper page verification value that is "0".

Therefore, according to the formula (2), in case that the third-bit-data-read voltage VC and the first-bit-data-read voltage VA are both smaller than the float voltage of a memory cell, the control gate of the memory cell is not turned on and outputs the first upper page verification value that is "0" when the third-bit-data-read voltage VC is applied; and the control gate of the memory cell is not turned on and outputs the second upper page verification value that is "0" when the first-bit-data-read voltage VA is applied. At this time, the MSB of the memory cell is identified as "1".

For example, in case that the third-bit-data-read voltage VC is larger than the float voltage of a memory cell and the first-bit-data-read voltage VA is smaller than the float voltage of a memory cell, the control gate of the memory cell is turned on and outputs the first upper page verification value that is "1" when the third-bit-data-read voltage VC is applied; and the control gate of the memory cell is not turned on and outputs the second upper page verification value that is "0" when the first-bit-data-read voltage VA is applied. At this time, the MSB of the memory cell is identified as "0".

For example, in case that the third-bit-data-read voltage VC and the first-bit-data-read voltage VA are both larger than the float voltage of a memory cell, the control gate of the memory cell is turned on and outputs the first upper page verification value that is "1" when the third-bit-data-read voltage VC is applied; and the control gate of the memory cell is turned on and outputs the second upper page verification value that is "1" when the first-bit-data-read voltage VA is applied. At this time, the MSB of the memory cell is identified as "1".

It should be noted that a 4 level cell NAND flash memory is just used to explain the invention in the first exemplary embodiment, and the invention is not limited thereto. In another exemplary embodiment, data stored in other type of MLC cell NAND flash memory may be read based on the principle described above.

For example, taking a 8 level cell NAND flash memory as an example, each storage state includes a LSB that is the first bit from the left, a center significant bit (CSB) that is the second bit from the left and a MSB that is the third bit from the left, wherein the LSB corresponds a lower page, the CSB corresponds a middle page and the MSB corresponds a upper page. In this example, a float voltage of each memory cell is identified into one of 8 storage states according to a first-bit-data-read voltage VA, a second-bit-data-read voltage VB, a third-bit-data-read voltage VC, a fourth-bit-data-read voltage VD, a fifth-bit-data-read voltage VE, a sixth-bit-data-read voltage VF and a seventh-bit-data-read voltage VG, wherein the 8 storage states respectively represent "111", "110", "100", "101", "001", "000", "010" and "011".

Figure 6:
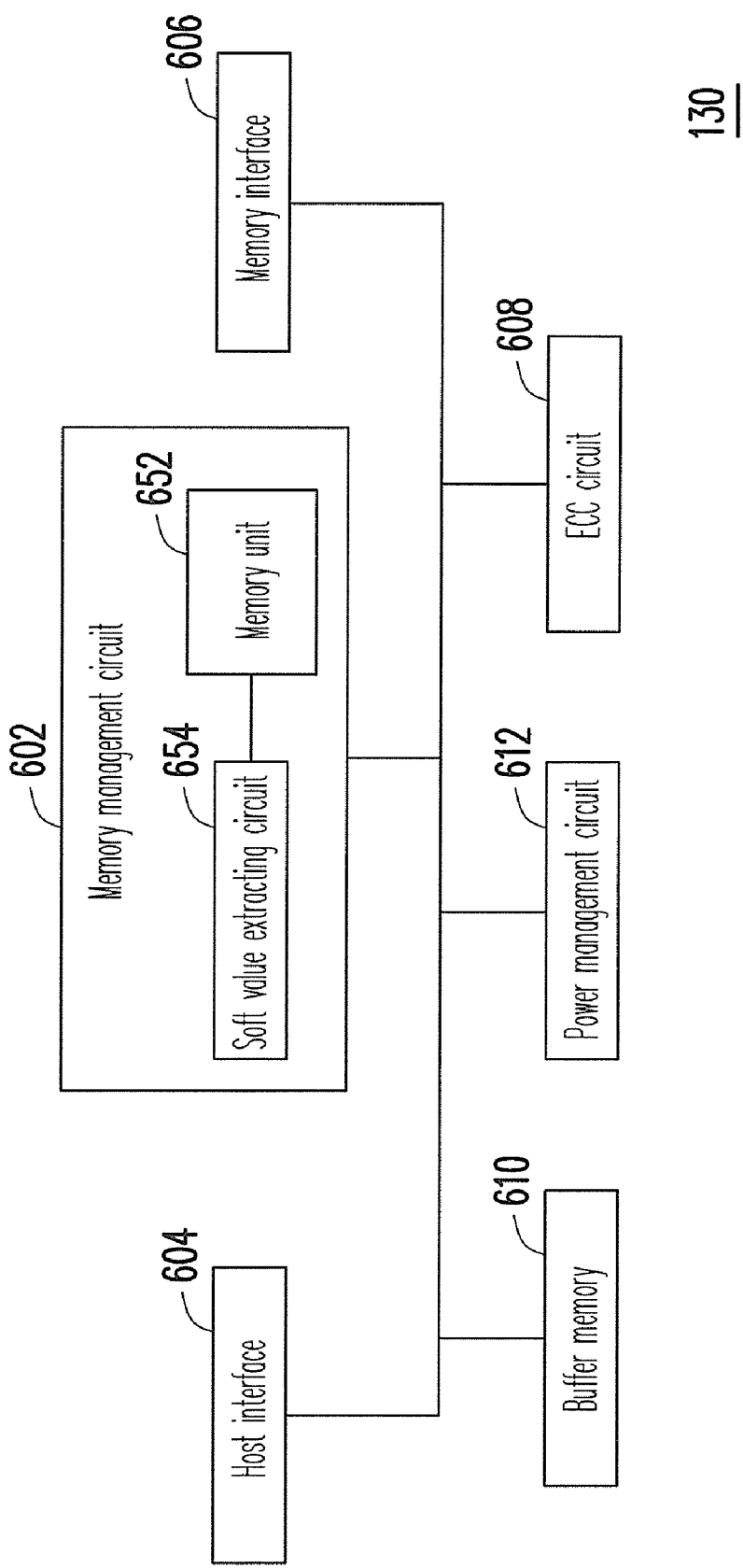
FIG. 6 is a schematic block diagram of a memory controller according to the first exemplary embodiment of the present invention.

FIG. 6 is a schematic block diagram of a memory controller according to the first exemplary embodiment of the present invention.

Referring to FIG. 6, the memory controller 130 includes a memory management circuit 602, a host interface 604, a memory interface 606 and an error checking and correcting (ECC) circuit 608.

The memory management circuit 602 is configured for controlling the whole operation of the memory controller 130. To be specific, the memory management circuit 602 has a plurality of control instructions, and when the memory storage apparatus 100 is enabled, the control instructions are executed to perform various operations on the memory module 120, such as data reading, data writing, data erasing, mapping table management, bad block management and so on.

In the first exemplary embodiment, the control instructions of the memory management circuit 602 are implemented in a filmware form. For example, the memory management circuit 602 has a micro-processor unit (not shown) and a read-only memory (not shown), and these control instructions are burned in the read-only memory. When the memory storage apparatus 100 is enabled, the control instructions are executed by the micro-processor unit to accomplish the data access method according to the first exemplary embodiment.

In another exemplary embodiment of the invention, the control instructions of the memory management circuit 602 are stored in a specific area (for example, the system area of the memory module exclusively used for storing system data)

of the memory module 120 as program codes. Additionally, the memory management circuit 602 may have a micro-processor unit (not shown), a read-only memory (not shown) and a random access memory (not shown). And, the read-only memory has a driver code, and when the memory controller 130 is enabled, the micro-processor unit executes the driver code to load the control instructions of the memory management circuit 602, which are stored in the memory module 120, into the random access memory of the memory management circuit 202. Then, the micro-processor unit runs these control instructions to accomplish the data access method and the memory management method of the first exemplary embodiment of the present invention. Additionally, the control instructions of the memory management circuit 602 may be implemented in a hardware form.

The host interface 604 is coupled to the memory management circuit 602, and configured for receiving and identifying commands and data from the host system 1000. Namely, the commands and data from the host system 1000 are transmitted to the memory management circuit 602 through the host interface 604. In the first exemplary embodiment, the host interface 604 is a USB interface corresponding to the connector 110. However, it should be understood that the invention is not limited thereto, and the host interface 604 may be a PATA interface, a SATA interface, an IEEE 1394 interface, a PCI express interface, a SD interface, a MS interface, a MMC interface, a CF interface, an IDE interface, or other suitable data transmission interfaces.

The memory interface 606 is coupled to the memory management circuit 602 and configured for accessing the memory module 120. Namely, data to be written into the memory module 120 is converted by the memory interface 606 into a format acceptable to the memory module 120.

The ECC circuit 608 is coupled to the memory management circuit 602, and configured for executing an error checking and correcting procedure to ensure data accuracy. To be specific, when the memory management circuit 602 reads data from the memory module 120, the ECC circuit 608 executes the ECC procedure for the read data. For example, in the first exemplary embodiment, the ECC circuit 608 is a low density parity check (LDPC) circuit and stores a log likelihood ratio (LLR) value table. When the memory management circuit 602 reads data from the memory module 120, the ECC circuit 608 executes the ECC procedure according to the read data and a corresponding LLR value in the LLR value table. It should be understood that the ECC circuit 608 may be a turbo code circuit in another exemplary embodiment.

For example, in the first exemplary embodiment, the memory controller 130 still includes a buffer memory 610. The buffer memory 610 is coupled to the memory management circuit 602 and configured to temporarily store data and commands from the host system 1000 or data from the memory module 120.

For example, in the first exemplary embodiment, the memory controller 130 still includes a power management circuit 612. The power management circuit 612 is coupled to the memory management circuit 602 and configured for controlling the power of the memory storage apparatus 100.

In the first exemplary embodiment, the memory management circuit 602 includes a memory unit 652 and a soft value extracting circuit 654.

The memory unit 652 is configured for recording the first-bit-data-read voltage VA, the second-bit-data-read voltage VB and the third-bit-data-read voltage VC.

The soft value extracting circuit 654 is coupled to the memory unit 652. As described above, when the flash memory module 120 is unused for long-term or frequently erased or leakage of electricity occurs in the memory cells of the flash memory module, the float voltages of the memory cells of the memory module 120 may change and thus error bits may occur. Herein, the soft value extracting circuit 654 is configured for obtaining soft values from the memory cells corresponding to the read data and calculates soft-information estimated values corresponding to the read data. Accordingly, the ECC circuit 608 is capable of correcting more error bits according to the soft-information estimated values.

Figure 7A:
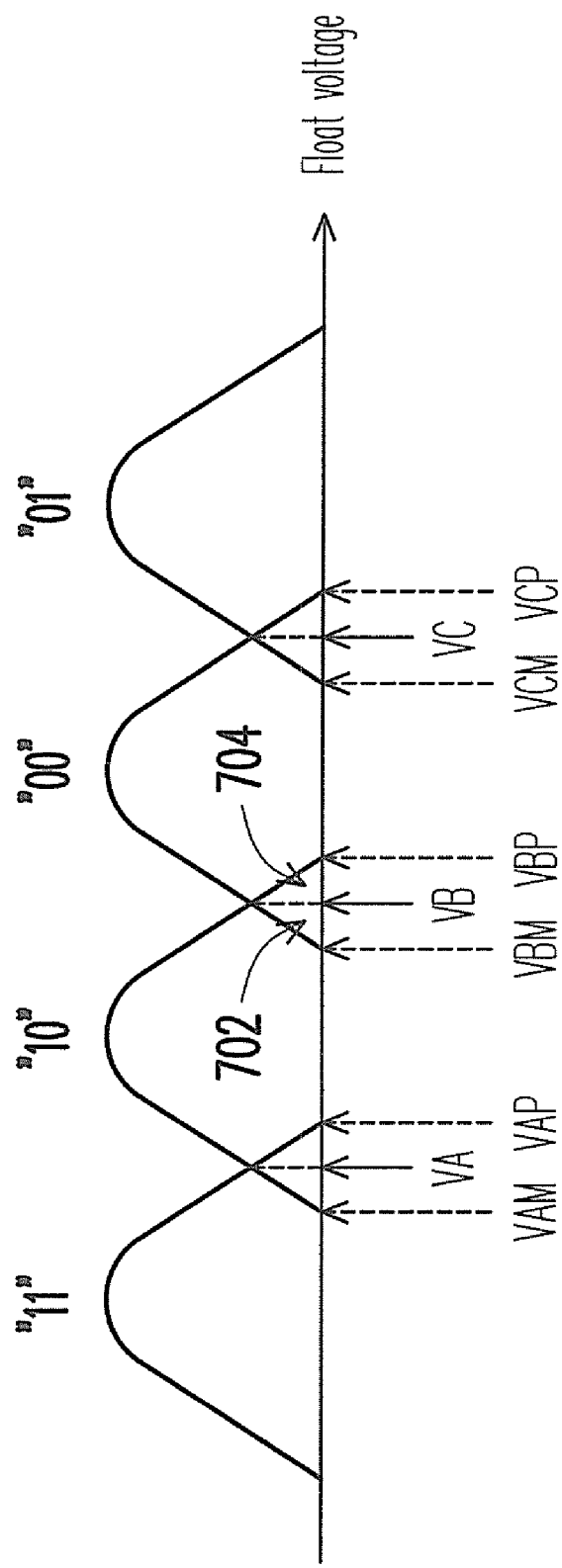
FIGS. 7A and 7B are statistical distribution diagrams of float voltages corresponding to data stored in a memory array according to another example of the first exemplary embodiment.
Figure 7B:
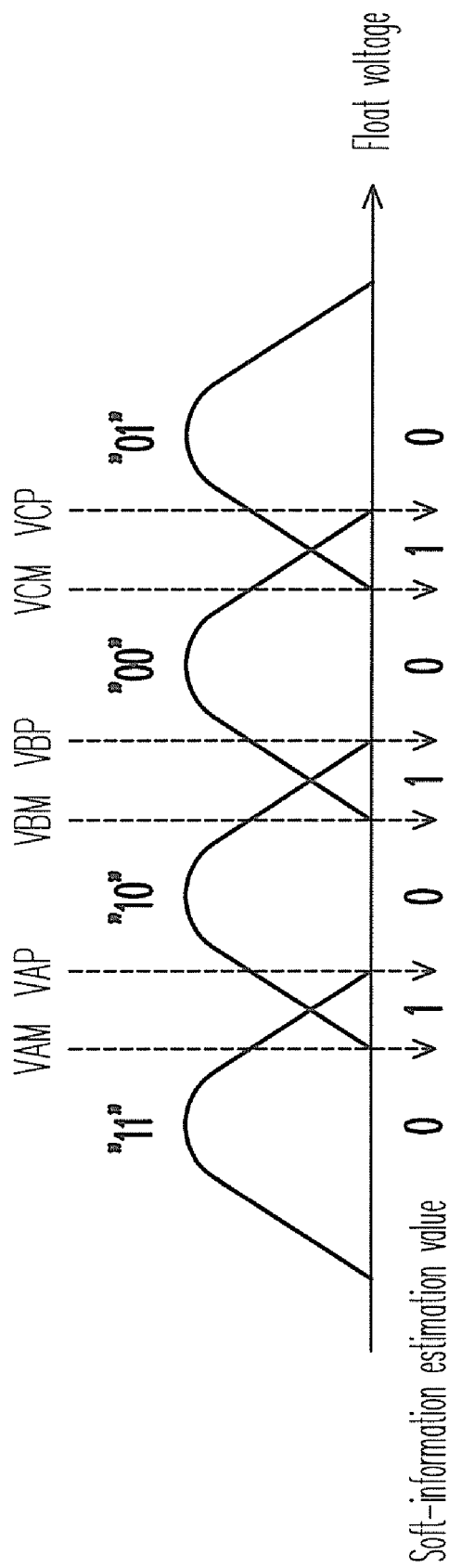

FIGS. 7A and 7B are statistical distribution diagrams of float voltages corresponding to data stored in a memory array according to another example of the first exemplary embodiment.

Referring to FIG. 7A, when the float voltage of a memory cell is identified according to the first-bit-data-read voltage VA, the second-bit-data-read voltage VB and the third-bit-data-read voltage VC, some bits are erroneously identified as error bits. For example, when applying the second-bit-data-read voltage VB to distinguish between the storage state "10" and "00", the block 702 and the block 704 show memory cells that the storage states thereof are erroneously identified. That is, the storage state of each memory cell at the block 702 is erroneously identified as "10", but that should be "00". And, the storage state of each memory cell at the block 704 is erroneously identified as "00", but that should be "10".

To be specific, when lower page data read from several memory cells of the memory module 120 can not be corrected, the soft value extracting circuit 654 sets a second minus-adjustment-bit-data-read voltage VBM and a second plus-adjustment-bit-data-read voltage VBP corresponding to the second-bit-data-read voltage VB and instructs the memory module 120 to apply the second minus-adjustment-bit-data-read voltage VBM and the second plus-adjustment-bit-data-read voltage VBP to these memory cell, such that the control gates of these memory cells output corresponding values (i.e., soft values). Moreover, The soft value extracting circuit 654 calculates a soft-information estimated value corresponding to each lower page data of these memory cells according to a formula (3):

$$\text{LSB\_SVI} = (\text{VBP})\text{SVD xor}(\text{VBM})\text{SVD} \qquad (3)$$

Wherein LSB_SVI represents a soft-information estimated value corresponding to the LSB of a memory cell, (VBP)SVD represents a soft value obtained by applying the second plus-adjustment-bit-data-read voltage VBP and (VBM)SVD represents a soft value obtained by applying the second minus-adjustment-bit-data-read voltage VBM.

Accordingly, the soft value extracting circuit 654 provides the calculated soft-information estimated values to the ECC circuit 608, and the ECC circuit 608 looks corresponding LLR values up in the LLR value table according to the read lower page data and the soft-information estimated values corresponding to the read lower page data, and thus performs the ECC procedure. It should be noted that the ECC circuit 608 may calculates the corresponding LLR values through mathematical operations according to the read lower page data and the soft-information estimated values corresponding to the read lower page data in another exemplary embodiment.

Additionally, in the exemplary embodiment, the LLR value is a parameter that indicates a probability of data being "0" or "1", and the LLR value can be defined as:

$$L(x) = \log\frac{x^0}{x^1}$$

Wherein $X^0$ is a probability of data being "0" and $X^1$ is a probability of data being "1". Additionally, at the present technology field, the LLR value is one of input parameters for calculating LDPC codes, and is used for correcting data through the LDPC circuit. The LLR value is used for various algorithms of LDPC circuits, such as a Sum-Product algorithm (SPA), a Log-likelihood-ratio algorithm, a Minimum-Sum algorithm (MSA), an Offset MSA and so on. These algorithms are well known by people at the present technology field, therefore the details are not explained herein.

Similarly, when upper page data read from several memory cells of the memory module 120 can not be corrected, the soft value extracting circuit 654 sets a third minus-adjustment-bit-data-read voltage VCM and a third plus-adjustment-bit-data-read voltage VCP corresponding to the third-bit-data-read voltage VC and a first minus-adjustment-bit-data-read voltage VAM and a first plus-adjustment-bit-data-read voltage VAP corresponding to the first-bit-data-read voltage VA, and instructs the memory module 120 to apply the third minus-adjustment-bit-data-read voltage VCM, the third plus-adjustment-bit-data-read voltage VCP, the first minus-adjustment-bit-data-read voltage VAM and the first plus-adjustment-bit-data-read voltage VAP to these memory cell, such that the control gates of these memory cells output corresponding values (i.e., soft values). Moreover, The soft value extracting circuit 654 calculates soft-information estimated values corresponding to the upper page data of memory cells according to formulas (4)~(6):

Pre1=(VCP)SVD xor(VCM)SVD     (4)

Pre2=(VAM)SVD xor Pre1     (5)

MSB_SVI=(VAP)SVD xor Pre2     (6)

wherein MSB_SVI represents a soft-information estimated value corresponding to the MSB of a memory cell, (VCP)SVD represents a soft value obtained by applying the third plus-adjustment-bit-data-read voltage VCP, (VCM)SVD represents a soft value obtained by applying the third minus-adjustment-bit-data-read voltage VCM, (VAP)SVD represents a soft value obtained by applying the first plus-adjustment-bit-data-read voltage VAP, and (VAM)SVD represents a soft value obtained by applying the first minus-adjustment-bit-data-read voltage VAM.

Accordingly, the soft value extracting circuit 654 provides the calculated soft-information estimated values to the ECC circuit 608, and the ECC circuit 608 looks corresponding LLR values up in the LLR value table according to the read upper page data and the soft-information estimated values corresponding to the read upper page data, and thus performs the ECC procedure.

As described above, when reading lower page data, the soft value extracting circuit 654 orderly applies the second minus-adjustment-bit-data-read voltage VBM and the second plus-adjustment-bit-data-read voltage VBP to obtain soft values and orderly performs XOR operations to generate soft-information estimated values. And, when reading upper page data, the soft value extracting circuit 654 orderly applies the third minus-adjustment-bit-data-read voltage VCM, the third plus-adjustment-bit-data-read voltage VCP, the first minus-adjustment-bit-data-read voltage VAM, and the first plus-adjustment-bit-data-read voltage VAP to obtain soft values and orderly performs XOR operations to generate soft-information estimated values. In particular, when both reading lower page data and upper page data, the soft value extracting circuit 654 orderly applies the second minus-adjustment-bit-data-read voltage VBM, the second plus-adjustment-bit-data-read voltage VBP, the third minus-adjustment-bit-data-read voltage VCM, the third plus-adjustment-bit-data-read voltage VCP, the first minus-adjustment-bit-data-read voltage VAM, and the first plus-adjustment-bit-data-read voltage VAP to obtain soft values and orderly performs XOR operations to generate soft-information estimated values.

In the present exemplary embodiment, the soft value extracting circuit 654 uses the XOR operator (as the formulas (3)~(6)) to calculate a soft-information estimated value. Nevertheless, it should be understood that the present invention is not limited thereto. In another exemplary embodiment, the soft value extracting circuit 654 may combines other operators to perform the XOR operation or use other operations to calculate the soft-information estimated value, such that the soft-information estimated value is calculated as "1" if the float voltage is between the corresponding plus and minus-adjustment-bit-data-read voltages and the soft-information estimated value is calculated as "0" if the float voltage is not between the corresponding plus and minus-adjustment-bit-data-read voltages. That is, as shown in FIG. 7B, the soft-information estimated value is "1" if the float voltage is between the first minus-adjustment-bit-data-read voltage VAM and the first plus-adjustment-bit-data-read voltage VAP or between the second minus-adjustment-bit-data-read voltage VBM and the second plus-adjustment-bit-data-read voltage VBP. And, the soft-information estimated value is "0" if the float voltage is between the first plus-adjustment-bit-data-read voltage and the second minus-adjustment-bit-data-read voltage.

In the first exemplary embodiment, the first minus-adjustment-bit-data-read voltage VAM, the first plus-adjustment-bit-data-read voltage VAP, the second minus-adjustment-bit-data-read voltage VBM, the second plus-adjustment-bit-data-read voltage VBP, the third minus-adjustment-bit-data-read voltage VCM, and the third plus-adjustment-bit-data-read voltage VCP are respectively set according to the first-bit-data-read voltage VA, the second-bit-data-read voltage VB, the third-bit-data-read voltage, and a first and second adjustment values VC.

For example, the first minus-adjustment-bit-data-read voltage VAM, the first plus-adjustment-bit-data-read voltage VAP, the second minus-adjustment-bit-data-read voltage VBM, the second plus-adjustment-bit-data-read voltage VBP, the third minus-adjustment-bit-data-read voltage VCM, and the third plus-adjustment-bit-data-read voltage VCP are set according to formulas (7)~(14):

VAM=VA−FAV     (7)

VAP=VA+FAV     (8)

VBM=VB−FAV     (9)

VBP=VB+SAV     (10)

VCM=VC−SAV     (11)

VCP=VC+SAV     (12)

FAV=(VB−VA)/N     (13)

SAV=(VC−VB)/M     (14)

Wherein FAV represents the first adjustment value, SAV represents the second adjustment value, and N and M represent error-distribution estimated values. In the present exemplary embodiment, the error-distribution estimated values are dynamically adjusted according to the usage status of the memory module 120. For example, the soft value extracting circuit 654 may adjust the error-distribution estimated values according to the number of times of erasing data on the memory module 120 or a data error rate obtained by the ECC procedure performed by the ECC circuit 608. Therefore, the first and second adjustment values are changed based on the adjustment of the error-distribution estimated values. For example, in the first exemplary embodiment, the error-distribution estimated value N is initially set as "5" and the error-distribution estimated value M is initially set as "6". Herein, the formulas (7)~(14) are examples for setting the minus-adjustment-bit-data-read voltages and the plus-adjustment-bit-data-read voltages, and the present invention is not limited thereto. Substantially, the first minus-adjustment-bit-data-read voltage VAM is smaller than the first-bit-data-read voltage VA and the first plus-adjustment-bit-data-read voltage VAP is larger than the first-bit-data-read voltage VA. Moreover, the error-distribution estimated values N and M may be the same or different from each other. And, the first and second adjustment values may also be the same or different from each other.

It should be noted that a 4 level cell NAND flash memory just is used to explain the invention in the first exemplary embodiment, and the invention is not limited thereto. In another exemplary embodiment, soft values and soft-information estimated values corresponding to other type of MLC NAND flash memory may be obtained and calculated based on the above-mentioned manner.

Figure 8:
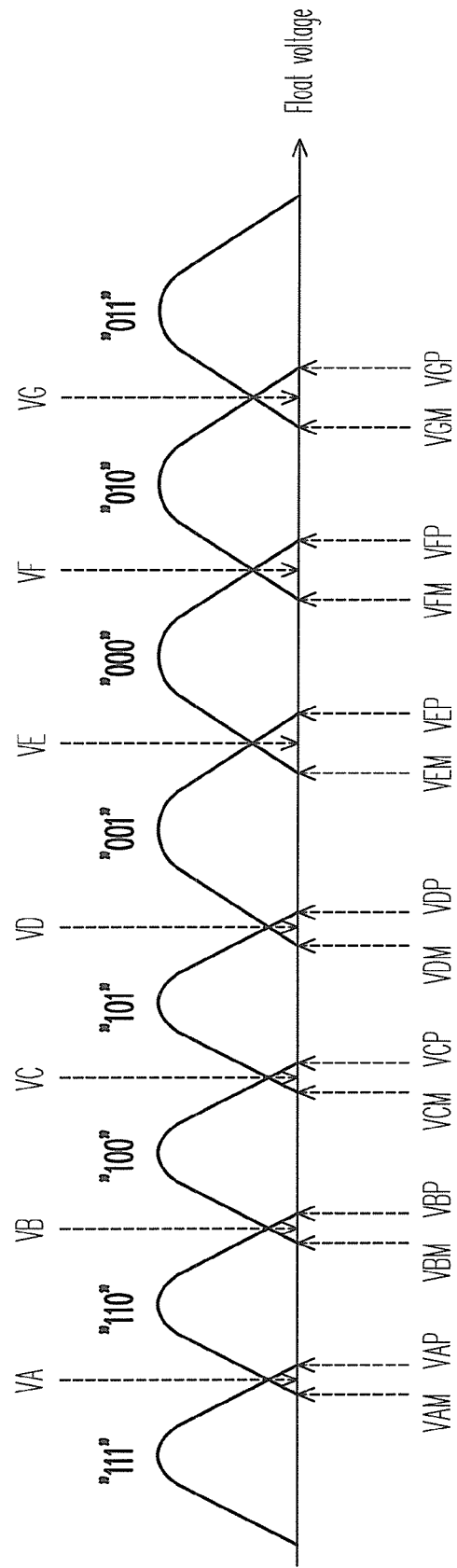
FIG. 8 is a statistical distribution diagram of float voltages corresponding to data stored in an 8 level cell NAND flash memory according to another exemplary embodiment of the present invention.

For example, taking a 8 level cell NAND flash memory as an example (as shown in FIG. 8), soft values corresponding to lower page data, middle page data and upper page data are obtained by applying the first minus-adjustment-bit-data-read voltage VAM, the first plus-adjustment-bit-data-read voltage VAP, the second minus-adjustment-bit-data-read voltage VBM, the second plus-adjustment-bit-data-read voltage VBP, the third minus-adjustment-bit-data-read voltage VCM, the third plus-adjustment-bit-data-read voltage VCP, the forth minus-adjustment-bit-data-read voltage VDM, the forth plus-adjustment-bit-data-read voltage VDP, the fifth minus-adjustment-bit-data-read voltage VEM, the fifth plus-adjustment-bit-data-read voltage VEP, the sixth minus-adjustment-bit-data-read voltage VFM, the sixth plus-adjustment-bit-data-read voltage VFP, the seventh minus-adjustment-bit-data-read voltage VGM and the seventh plus-adjustment-bit-data-read voltage VGP, and thus soft-information estimated values corresponding to lower page data, middle page data and upper page data are calculated according to the obtained soft values.

Figure 9:
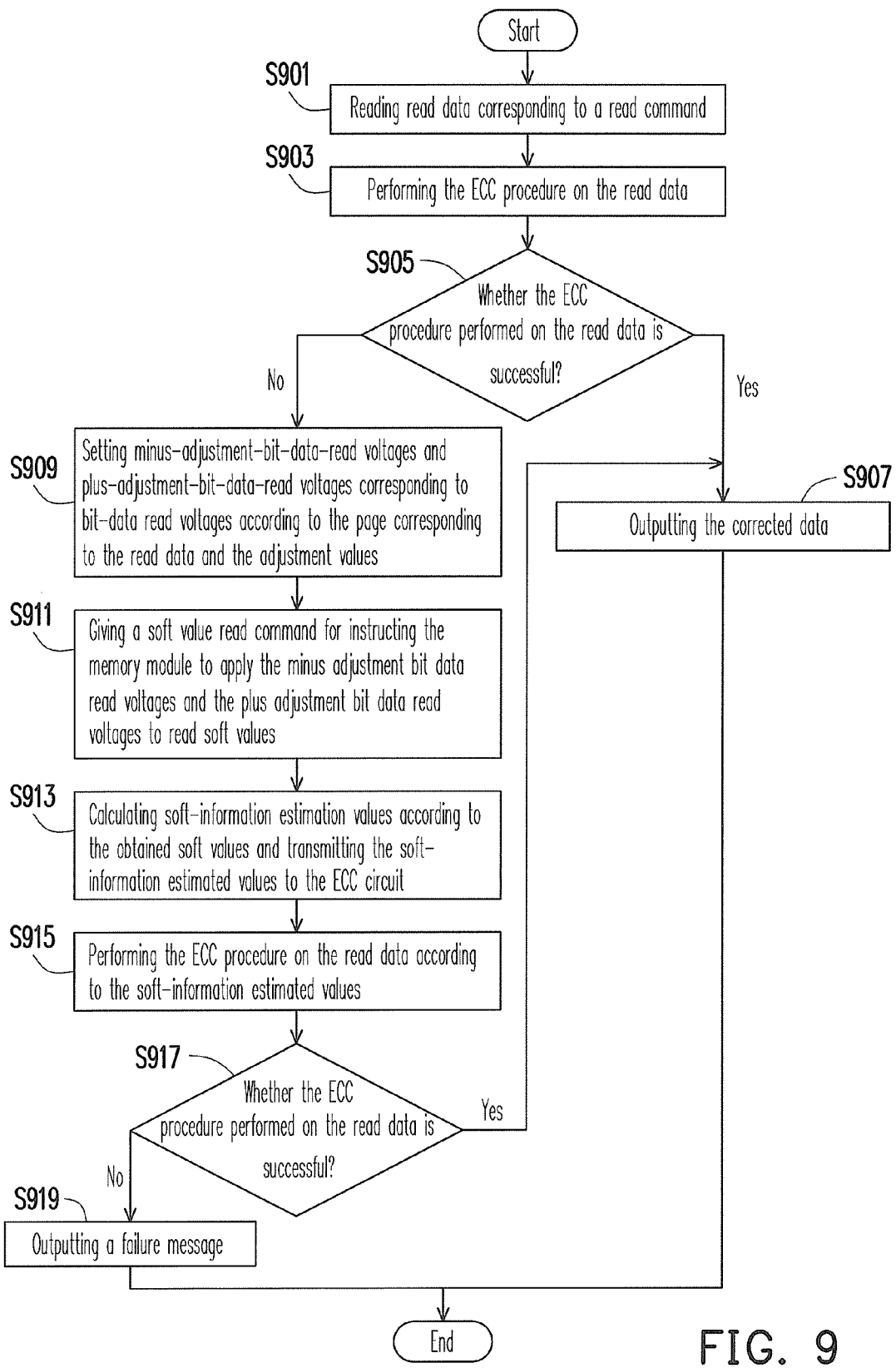
FIG. 9 is a flowchart illustrating a data reading method according to the first embodiment of the present invention.

FIG. 9 is a flowchart illustrating a data reading method according to the first embodiment of the present invention.

Referring to FIG. 9, first, when the memory controller 130 receives a read command from the host system 1000, in step S901, read data corresponding to the read command is read. To be specific, the memory management circuit 602 gives a read command to the memory module 120 and the soft value extracting circuit 654 reads the read data corresponding to the read command from the data input/output buffer 210 of the memory module 120 via the memory interface.

Then, in step S903, the ECC procedure is performed on the read data. Herein, the ECC circuit 608 performs the ECC procedure on the read data and transmits a correcting result to the soft value extracting circuit 654. After that, in step S905, the soft value extracting circuit 654 determines whether the ECC procedure performed on the read data is successful. That is, the soft value extracting circuit 654 determines whether all error bits of the read data are corrected by the ECC circuit 608.

If the ECC procedure performed on the read data is successful, in step S907, the soft value extracting circuit 654 outputs the corrected data. To be specific, the corrected data is transmitted to the host system 1000 via the host interface 604.

If the ECC procedure performed on the read data is not successful, in step S909, the soft value extracting circuit 654 sets minus-adjustment-bit-data-read voltages and plus-adjustment-bit-data-read voltages corresponding to bit-data-read voltages according to the page (e.g., upper page or lower page) corresponding to the read data and the adjustment values (e.g., the foregoing first and second adjustment values). And, in step S911, the soft value extracting circuit 654 gives a soft value read command for instructing the memory module 120 to apply the minus-adjustment-bit-data-read voltages and the plus-adjustment-bit-data-read voltages to read soft values. To be specific, in steps S909 and S911, the soft value extracting circuit 654 identifies the bit-data-read voltages for reading the read data according to the page corresponding to the read data and sets the minus-adjustment-bit-data-read voltages and the plus-adjustment-bit-data-read voltages corresponding to the bit-data-read voltages according to the adjustment values. The manners that set and apply minus-adjustment-bit-data-read voltages and plus-adjustment-bit-data-read voltages to obtain the soft values according to different pages have been described as above, so they will not be repeated here.

Then, in step S913, the soft value extracting circuit 654 calculates soft-information estimated values according to the obtained soft values and transmits the soft-information estimated values to the ECC circuit 608.

In step S915, the ECC circuit 608 performs the ECC procedure on the read data according to the received soft-information estimated values and transmits a correcting result to the soft value extracting circuit 654. After that, in step S917, the soft value extracting circuit 654 determines whether the ECC procedure performed on the read data is successful. If the ECC procedure performed on the read data is successful, step S907 is performed. And, if the ECC procedure performed on the read data is not successful, in step S919, the soft value extracting circuit 654 outputs a failure message indicating that data reading is fail.

Second Exemplary Embodiment

A memory storage apparatus of a second exemplary embodiment is substantially the same as the memory storage apparatus of the first exemplary embodiment, and the memory storage apparatus of the second exemplary embodiment is described as the following with FIG. 1, FIG. 2 and FIG. 6.

In the second exemplary embodiment, data reading and data writing are the same as that of the first exemplary embodiment (as shown in FIG. 3 and FIG. 4) and the soft value extracting circuit 654 obtains soft values and calculates soft-information estimated values for the ECC procedure performed by the ECC circuit 608 according to the manners described in the first exemplary embodiment. Only differences between the second exemplary embodiment and the first exemplary embodiment are described in the following.

In the second exemplary embodiment, the soft value extracting circuit 654 is configured for obtaining extended soft values from the memory cells corresponding to the read data and calculates extended soft-information estimated values corresponding to the read data. Accordingly, the ECC circuit 608 is capable of correcting more error bits according to the extended soft-information estimated values.

Figure 10A:
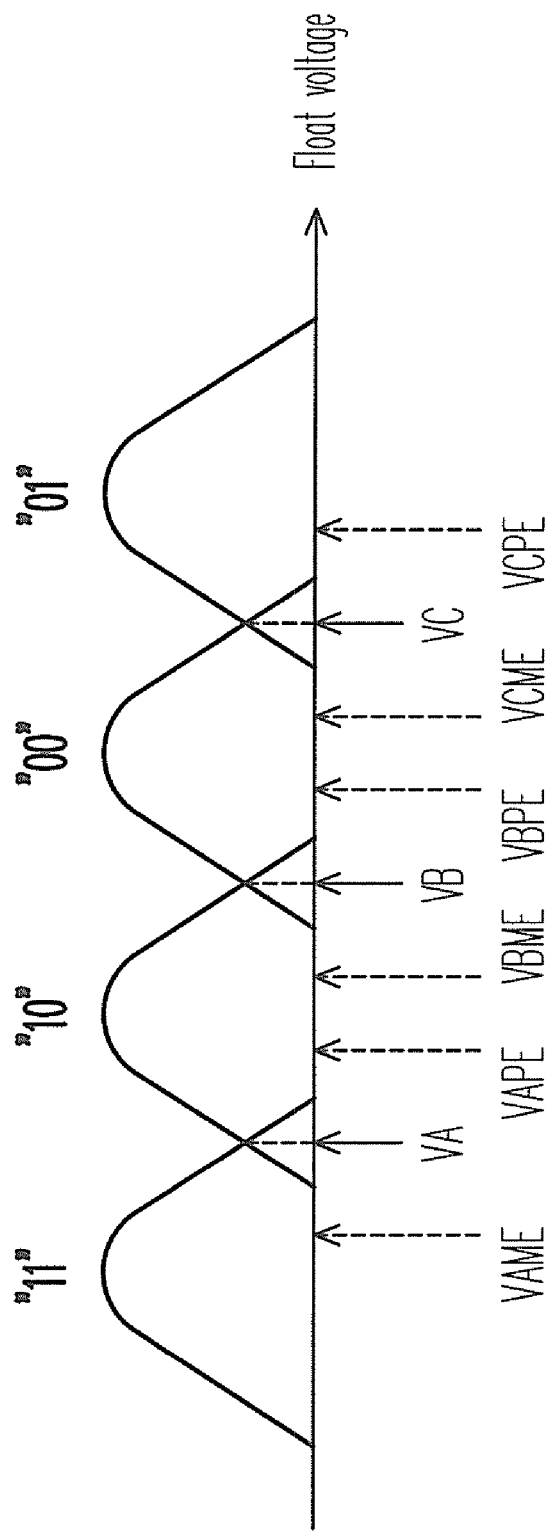
FIGS. 10A and 10B are statistical distribution diagrams of float voltages corresponding to data stored in a memory array according to a second exemplary embodiment of the present invention.
Figure 10B:
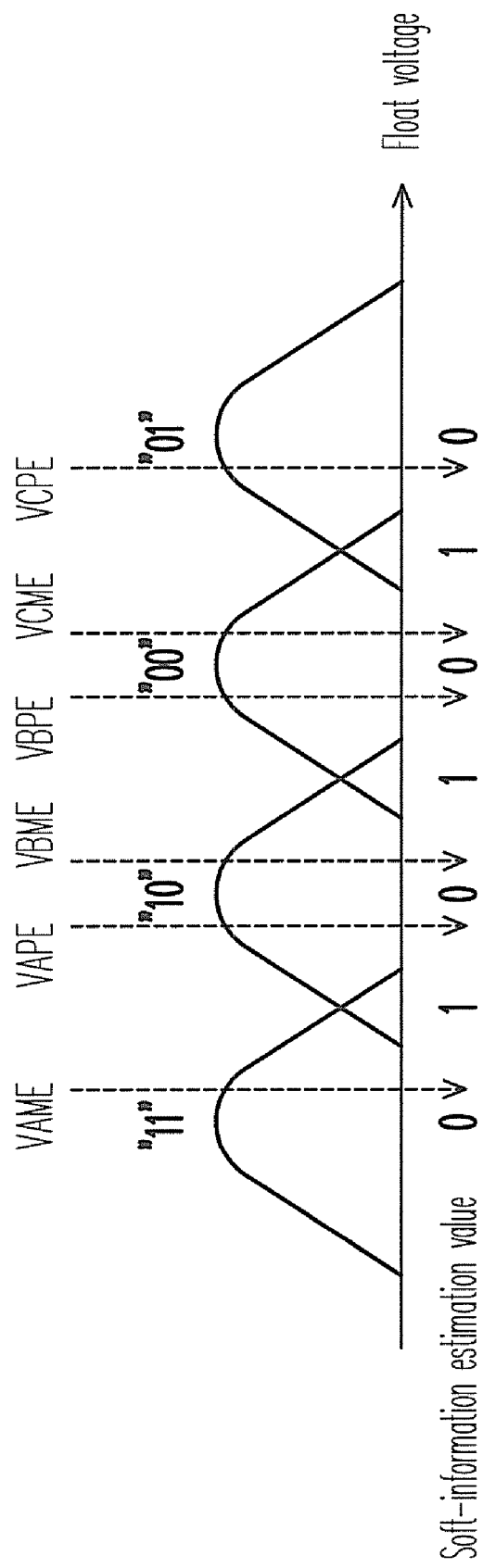

FIGS. 10A and 10B are statistical distribution diagrams of float voltages corresponding to data stored in a memory array according to a second exemplary embodiment of the present invention.

Referring to FIG. 10A, when lower page data read from several memory cells of the memory module 120 can not be corrected, the soft value extracting circuit 654 sets a second extended minus-adjustment-bit-data-read voltage VBME and a second extended plus-adjustment-bit-data-read voltage VBPE corresponding to the second-bit-data-read voltage VB and instructs the memory module 120 to apply the second extended minus-adjustment-bit-data-read voltage VBME and the second extended plus-adjustment-bit-data-read voltage VBPE to these memory cell, such that the control gates of these memory cells output corresponding values (i.e., extended soft values). Moreover, The soft value extracting circuit 654 calculates extended soft-information estimated values corresponding to the lower page data of memory cells according to a formula (15-1):

$$LSB\_SVIE=(VBPE)SVDE \text{ xor}(VBME)SVDE \quad (15\text{-}1)$$

wherein LSB_SVIE represents an extended soft-information estimated value corresponding to the LSB of a memory cell, (VBP)SVDE represents an extended soft value obtained by applying the second extended plus-adjustment-bit-data-read voltage VBPE and (VBM)SVDE represents an extended soft value obtained by applying the second extended minus-adjustment-bit-data-read voltage VBME.

Accordingly, the soft value extracting circuit 654 provides the calculated extended soft-information estimated values to the ECC circuit 608, and the ECC circuit 608 looks corresponding LLR values up in the LLR value table according to the read lower page data and the soft-information estimated values and extended soft-information estimated values corresponding to the read lower page data, and thus performs the ECC procedure.

Similarly, when upper page data read from several memory cells of the memory module 120 can not be corrected, the soft value extracting circuit 654 sets a third extended minus-adjustment-bit-data-read voltage VCME and a third extended plus-adjustment-bit-data-read voltage VCPE corresponding to the third-bit-data-read voltage VC and a first extended minus-adjustment-bit-data-read voltage VAME and a first extended plus-adjustment-bit-data-read voltage VAPE corresponding to the first-bit-data-read voltage VA, and instructs the memory module 120 to apply the third extended minus-adjustment-bit-data-read voltage VCME, the third extended plus-adjustment-bit-data-read voltage VCPE, the first extended minus-adjustment-bit-data-read voltage VAME and the first extended plus-adjustment-bit-data-read voltage VAPE to these memory cell, such that the control gates of these memory cells output corresponding values (i.e., extended soft values). Moreover, The soft value extracting circuit 654 calculates extended soft-information estimated values corresponding to the upper page data of memory cells according to formulas (15-2)~(17):

$$EPre1=(VCPE)SVDE \text{ xor}(VCME)SVDE \quad (15\text{-}2)$$

$$EPre2=(VAME)SVDE \text{ xor } EPre1 \quad (16)$$

$$MSB\_SVIE=(VAPE)SVDE \text{ xor } EPre2 \quad (17)$$

wherein MSB_SVIE represents an extended soft-information estimated value corresponding to the MSB of a memory cell, (VCP)SVDE represents an extended soft value obtained by applying the third extended plus-adjustment-bit-data-read voltage VCPE, (VCM)SVDE represents an extended soft value obtained by applying the third extended minus-adjustment-bit-data-read voltage VCME, (VAP)SVDE represents an extended soft value obtained by applying the first extended plus-adjustment-bit-data-read voltage VAPE, and (VAM)SVDE represents an extended soft value obtained by applying the first extended minus-adjustment-bit-data-read voltage VAME.

Accordingly, the soft value extracting circuit 654 provides the calculated extended soft-information estimated values to the ECC circuit 608, and the ECC circuit 608 looks corresponding LLR values up in the LLR value table according to the read upper page data and the soft-information estimated values and extended soft-information estimated values corresponding to the read upper page data, and thus performs the ECC procedure.

As described above, when reading lower page data, the soft value extracting circuit 654 orderly applies the second extended minus-adjustment-bit-data-read voltage VBME and the second extended plus-adjustment-bit-data-read voltage VBPE to obtain extended soft values and orderly performs XOR operations to generate extended soft-information estimated values. And, when reading upper page data, the soft value extracting circuit 654 orderly applies the third extended minus-adjustment-bit-data-read voltage VCME, the third extended plus-adjustment-bit-data-read voltage VCPE, the first extended minus-adjustment-bit-data-read voltage VAME, and the first extended plus-adjustment-bit-data-read voltage VAPE to obtain extended soft values and orderly performs XOR operations to generate extended soft-information estimated values. In particular, when both reading lower page data and upper page data, the soft value extracting circuit 654 orderly applies the third extended minus-adjustment-bit-data-read voltage VCME, the third extended plus-adjustment-bit-data-read voltage VCPE, the first extended minus-adjustment-bit-data-read voltage VAME, and the first extended plus-adjustment-bit-data-read voltage VAPE to obtain extended soft values and orderly performs XOR operations to generate extended soft-information estimated values.

In the present exemplary embodiment, the soft value extracting circuit 654 uses XOR operations (as the formulas (15-1), (15-2), (16), and (17)) to calculate the extended soft-information estimated values. However, it should be noticed that the present invention is not limited thereto. In another exemplary embodiment, the soft value extracting circuit 654 may combines other operators to perform the XOR operation or use other operations to calculate the extended soft-information estimated value, such that the extended soft-information estimated value is calculated as "1" if the float voltage is between the corresponding extended plus and minus-adjustment-bit-data-read voltages and the extended soft-information estimated value is calculated as "0" if the float voltage is not between the corresponding extended plus and minus-adjustment-bit-data-read voltages. That is, as shown in FIG. 10B, the extended soft-information estimated value is "1" if the float voltage is between the first extended minus-adjustment-bit-data-read voltage VAM and the first extended plus-adjustment-bit-data-read voltage VAP or between the second extended minus-adjustment-bit-data-read voltage VBM and the second extended plus-adjustment-bit-data-read voltage VBP. And, the extended soft-information estimated value is "0" if the float voltage is between the first extended plus-adjustment-bit-data-read voltage and the second extended minus-adjustment-bit-data-read voltage.

In the second exemplary embodiment, the first extended minus-adjustment-bit-data-read voltage VAME, the first extended plus-adjustment-bit-data-read voltage VAPE, the second extended minus-adjustment-bit-data-read voltage VBME, the second extended plus-adjustment-bit-data-read voltage VBPE, the third extended minus-adjustment-bit-data-read voltage VCME, and the third extended plus-adjustment-bit-data-read voltage VCPE are respectively set according to the first-bit-data-read voltage VA, the second-bit-data-read voltage VB, the third-bit-data-read voltage VC, and the first and second adjustment values.

For example, the first extended minus-adjustment-bit-data-read voltage VAME, the first extended plus-adjustment-bit-data-read voltage VAPE, the second extended minus-adjustment-bit-data-read voltage VBME, the second extended plus-adjustment-bit-data-read voltage VBPE, the third extended minus-adjustment-bit-data-read voltage VCME, and the third extended plus-adjustment-bit-data-read voltage VCPE are set according to formulas (18)~(23):

$$VAME = VA - C1 \times FAV \quad (18)$$

$$VAPE = VA + C1 \times FAV \quad (19)$$

$$VBME = VB - C1 \times FAV \quad (20)$$

$$VBPE = VB + C2 \times SAV \quad (21)$$

$$VCME = VC - C2 \times SAV \quad (22)$$

$$VCPE = VC + C2 \times SAV \quad (23)$$

In the present exemplary embodiment, C1 and C2 are 2 and 2.5, respectively. Herein, the formulas (18)~(23) are examples for setting the extended minus-adjustment-bit-data-read voltages and extended plus-adjustment-bit-data-read voltages, and the present invention is not limited thereto. And, C1 and C2 may be more than 1.

Figure 11A:
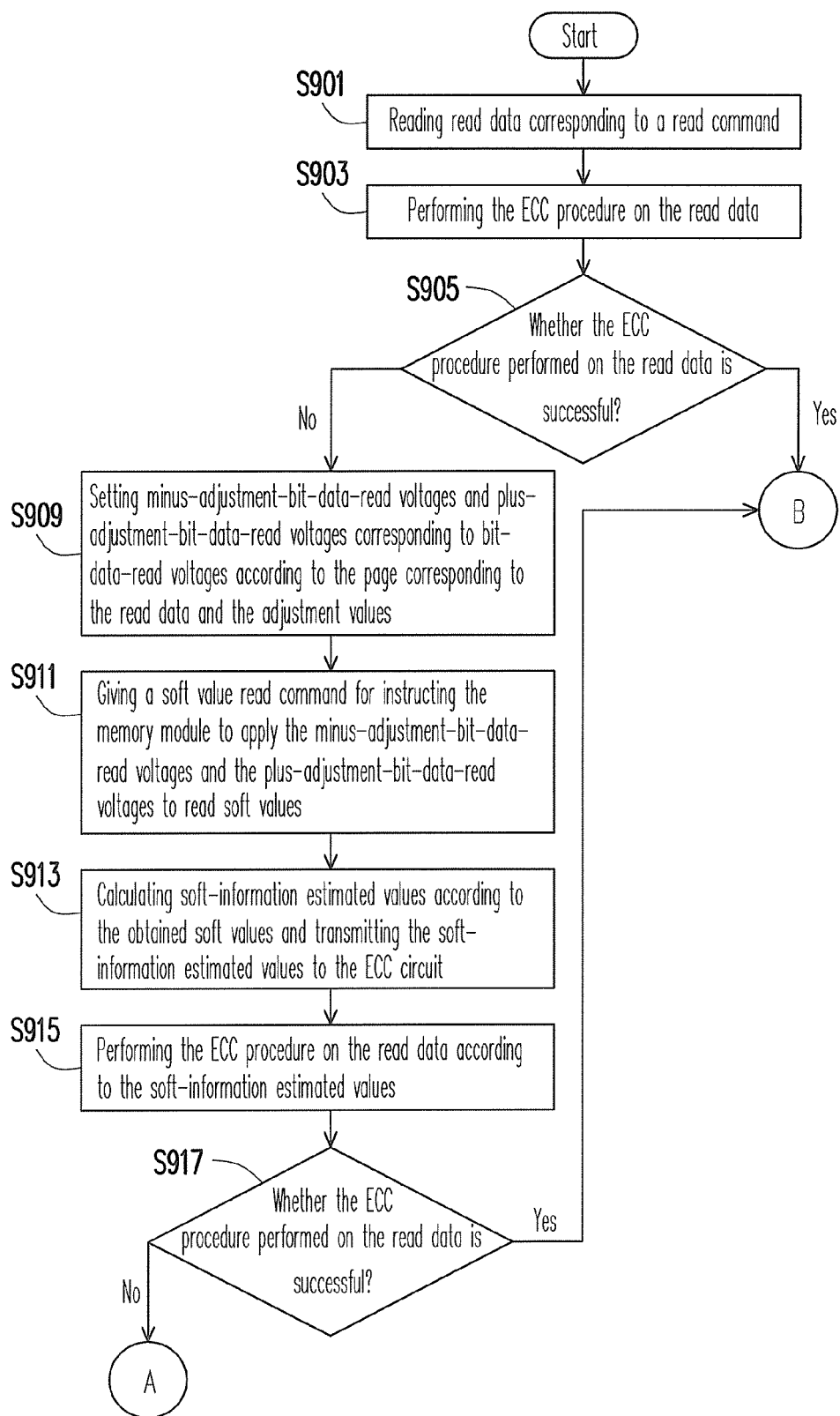
FIGS. 11A and 11B are flowcharts illustrating a data reading method according to the second embodiment of the present invention.
Figure 11B:
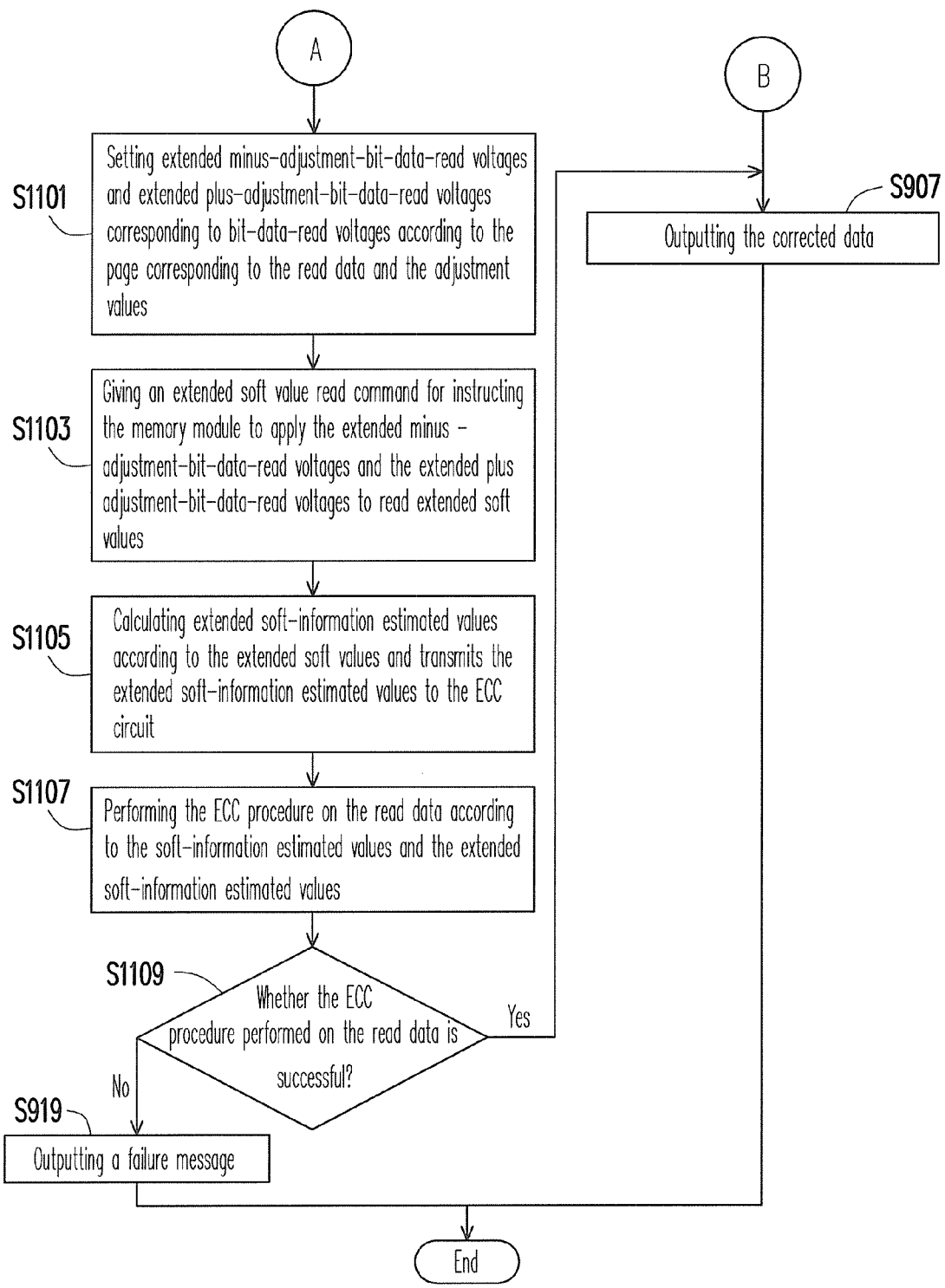

FIGS. 11A and 11B are flowcharts illustrating a data reading method according to the second embodiment of the present invention, wherein node A and node B are used for linking the FIG. 11A and FIG. 11B.

Referring to FIG. 11A and FIG. 11B, steps S901, S903, S905, S907, S911, S913, S915, S917 and S919 have been described as above, so they will not be repeated here.

If in step S917, the ECC procedure performed on the read data is not successful, in step S1101, the soft value extracting circuit 654 sets extended minus-adjustment-bit-data-read voltages and extended plus-adjustment-bit-data-read voltages corresponding to bit-data-read voltages according to the page (e.g., upper page or lower page) corresponding to the read data and the adjustment values (e.g., the foregoing first and second adjustment values). And, in step S1103, the soft value extracting circuit 654 gives an extended soft value read command for instructing the memory module 120 to apply the extended minus-adjustment-bit-data-read voltages and the extended plus-adjustment-bit-data-read voltages to read extended soft values. To be specific, in steps S1101 and S1103, the soft value extracting circuit 654 identifies the bit-data-read voltages for reading the read data according to the page corresponding to the read data and sets the extended minus-adjustment-bit-data-read voltages and the extended plus-adjustment-bit-data-read voltages corresponding to the bit-data-read voltages according to the adjustment values. The manners that set and apply extended minus-adjustment-bit-data-read voltages and extended plus-adjustment-bit-data-read voltages to obtain the extended soft values according to different pages have been described as above, so they will not be repeated here.

Then, in step S1105, the soft value extracting circuit 654 calculates extended soft-information estimated values according to the extended soft values and transmits the extended soft-information estimated values to the ECC circuit 608.

In step S1107, the ECC circuit 608 performs the ECC procedure on the read data according to the soft-information estimated values and the extended soft-information estimated values and transmits a correcting result to the soft value extracting circuit 654. After that, in step S1109, the soft value extracting circuit 654 determines whether the ECC procedure performed on the read data is successful. If the ECC procedure performed on the read data is successful, step S907 is performed. If the ECC procedure performed on the read data is not successful, step S919 is performed.

In the present exemplary embodiment, the memory module 120 temporarily stores the soft values obtained by applying the minus and plus-adjustment-bit-data-read voltages and the extended soft values obtained by applying the extended minus and plus-adjustment-bit-data-read voltages in the data input/output buffer 210, and the soft value extracting circuit 654 reads the soft values and the extended soft values from the data input/output buffer 210. It should be noted that in another exemplary embodiment, the data input/output buffer 210 may be composed of a bit input/output buffer, a soft value input/output buffer and an extended soft value input/output buffer. In particular, the read data is temporarily stored in the bit input/output buffer, the soft values are temporarily stored in the soft value input/output buffer and the extended soft values are stored in the extended soft value input/output buffer. Accordingly, when multi-channels are configured between the memory controller 130 and the memory module 120 for transmitting data, the time for transmitting the read data, the soft values and the extended soft values can effectively be shortened by simultaneously reading data from the bit input/output buffer, the soft value input/output buffer and the extended soft value input/output buffer.

Third Embodiment

Figure 12:
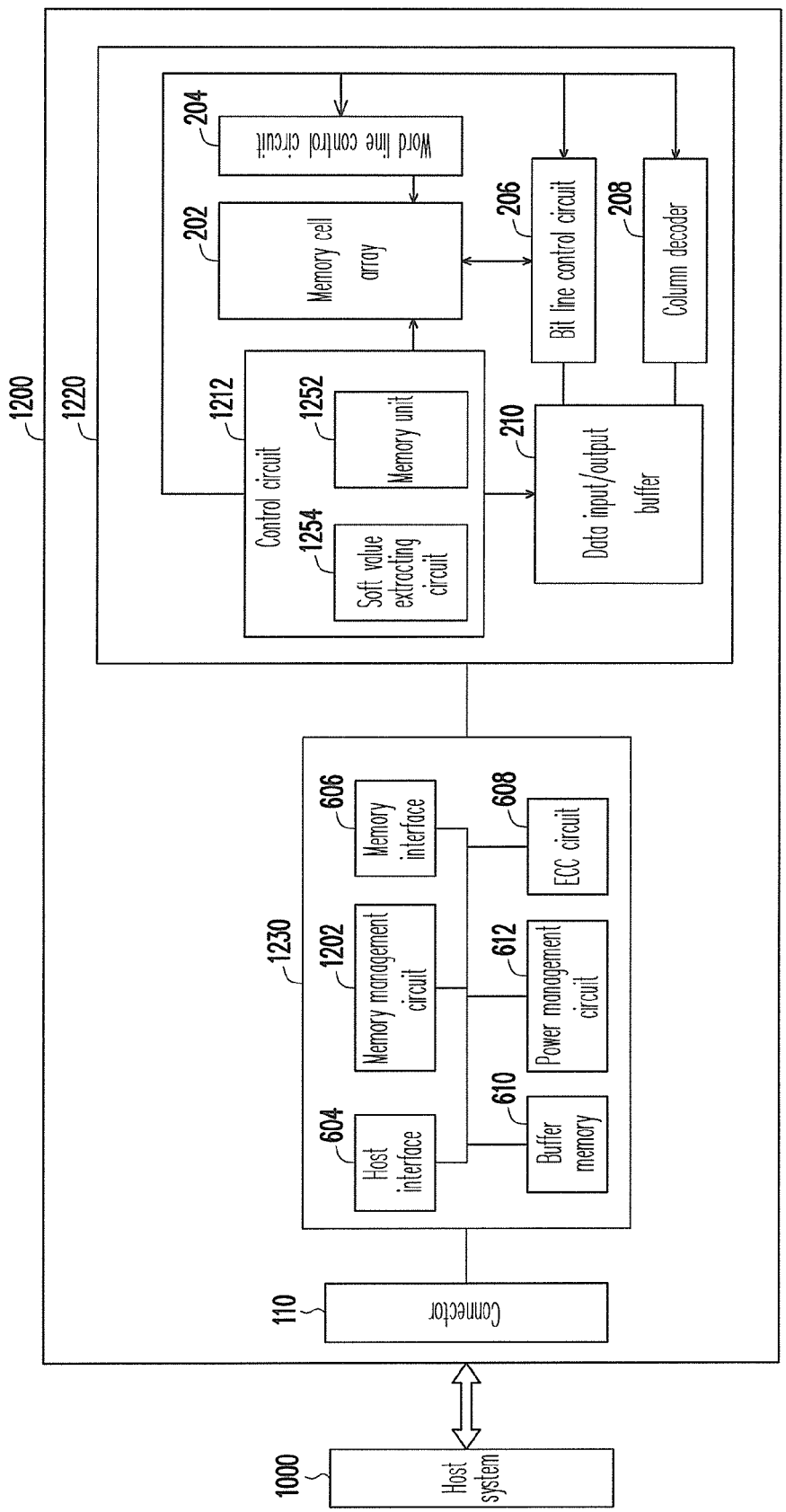
FIG. 12 is a schematic block diagram illustrating a memory storage apparatus according to the third exemplary embodiment of the present invention.

FIG. 12 is a schematic block diagram illustrating a memory storage apparatus according to the third exemplary embodiment of the present invention.

Referring to FIG. 12, a memory storage apparatus 1200 is usually used together with the host system 1000 so that the host system 1000 can write data into or read data from the memory storage apparatus 1200.

The memory storage apparatus 1200 includes the connector 110, the memory module 1220 and a memory controller 1230, wherein the structure and the function of the connector 110 have been described as above, so they will not be repeated here.

The memory module 1220 is configured for storing data written by the host system 1000. In this exemplary embodiment, the memory module 1220 is a MLC flash memory module.

The memory module 1220 includes the memory cell array 202, the word line control circuit 204, the bit line control circuit 206, the column decoder 208, the data input/output buffer 210 and a control circuit 1212.

The structures and the functions of the memory cell array 202, the word line control circuit 204, the bit line control circuit 206, the column decoder 208 and the data input/output buffer 210 have been described as above, so they will not be repeated here.

In the third exemplary embodiment, the control circuit 1212 also controls the word line control circuit 204, the bit line control circuit 206, the column decoder 208 and the data input/output buffer 210 to write data or read data according to the manners described in the first exemplary embodiment (as shown in FIG. 3 and FIG. 4). Additionally, the control circuit 1212 includes a memory unit 1252 and a soft value extracting circuit 1254.

The memory unit 1252 is configured for recording the first-bit-data-read voltage VA, the second-bit-data-read voltage VB and the third-bit-data-read voltage VC.

The soft value extracting circuit 1254 is coupled to the memory unit 1252 and configured for calculating soft-information estimated values.

To be specific, when the control circuit 1212 receives a soft value request command from the memory controller 1230, the soft value extracting circuit 1254 obtains soft values based on the memory cells corresponding to the soft value request command, and calculates corresponding soft-information estimated values according to the obtained soft values.

For example, when the control circuit 1212 receives a soft-information estimated value request command corresponding to lower page data of several memory cells of the memory module 1220 from the memory controller 1230, the soft value extracting circuit 1254 sets a second minus-adjustment-bit-data-read voltage VBM and a second plus-adjustment-bit-data-read voltage VBP corresponding to the second-bit-data-read voltage VB and instructs the word line control circuit 204 to apply the second minus-adjustment-bit-data-read voltage VBM and the second plus-adjustment-bit-data-read voltage VBP to these memory cell, such that the control gates of these memory cells output corresponding soft values (as shown in FIG. 7B). Moreover, the soft value extracting circuit 1254 calculates soft-information estimated values of the lower page data according to the formula (3) and the calculated soft-information estimated values are transmitted to the memory controller 1230 via the data input/output buffer 210.

Similarly, when the control circuit 1212 receives a soft-information estimated value request command corresponding to upper page data of several memory cells of the memory module 1220 from the memory controller 1230, the soft value extracting circuit 1254 sets a third minus-adjustment-bit-data-read voltage VCM and a third plus-adjustment-bit-data-read voltage VCP corresponding to the third-bit-data-read voltage VC and a first minus-adjustment-bit-data-read voltage VAM and a first plus-adjustment-bit-data-read voltage VAP corresponding to the first-bit-data-read voltage VA, and instructs the word line control circuit 204 to apply the third minus-adjustment-bit-data-read voltage VCM, the third plus-adjustment-bit-data-read voltage VCP, the first minus-adjustment-bit-data-read voltage VAM and the first plus-adjustment-bit-data-read voltage VAP to these memory cell, such that the control gates of these memory cells output corresponding soft values. Moreover, the soft value extracting circuit 1254 calculates soft-information estimated values of the upper page data according to the formulas (4)~(6) and the calculated soft-information estimated values are transmitted to the memory controller 1230 via the data input/output buffer 210.

In the third exemplary embodiment, the soft value extracting circuit 1254 sets the first minus-adjustment-bit-data-read voltage VAM, the first plus-adjustment-bit-data-read voltage VAP, the second minus-adjustment-bit-data-read voltage VBM, the second plus-adjustment-bit-data-read voltage VBP, the third minus-adjustment-bit-data-read voltage VCM, and the third plus-adjustment-bit-data-read voltage VCP according to the formulas (7)~(14). It should be noted that the formulas (7)~(14) are examples for setting the minus-adjustment-bit-data-read voltages and plus-adjustment-bit-data-read voltages, and the soft value extracting circuit 1254 is not limited thereto.

Additionally, in the third exemplary embodiment, a 4 level cell NAND flash memory is just used to explain the invention. However, the memory module 1220 may be other type of MLC NAND flash memory module. For example, taking a 8 level cell NAND flash memory as an example (as shown in FIG. 8), the soft value extracting circuit 1254 may set and apply the first minus-adjustment-bit-data-read voltage VAM, the first plus-adjustment-bit-data-read voltage VAP, the second minus-adjustment-bit-data-read voltage VBM, the second plus-adjustment-bit-data-read voltage VBP, the third minus-adjustment-bit-data-read voltage VCM, the third plus-adjustment-bit-data-read voltage VCP, the forth minus-adjustment-bit-data-read voltage VDM, the forth plus-adjustment-bit-data-read voltage VDP, the fifth minus-adjustment-bit-data-read voltage VEM, the fifth plus-adjustment-bit-data-read voltage VEP, the sixth minus-adjustment-bit-data-read voltage VFM, the sixth plus-adjustment-bit-data-read voltage VFP, the seventh minus-adjustment-bit-data-read voltage VGM and the seventh plus-adjustment-bit-data-read voltage VGP to obtain soft values corresponding to lower page data, middle page data and upper page data and thus calculates soft-information estimated values corresponding to lower page data, middle page data and upper page data.

The memory controller 1230 is coupled to the connector 110 and the memory module 1220. The memory controller 1230 executes a plurality of logic gates or control instructions implemented in a hardware form or a firmware faun and performs various data operations in the memory module 1220 according to commands of the host system 1000, such as data writing, reading, and erasing.

The memory controller 1230 includes a memory management circuit 1202, the host interface 604, the memory interface 606, the ECC circuit 608 the buffer memory 610 and the power management circuit 618.

The memory management circuit 1202 is configured for controlling the whole operation of the memory controller 1230. To be specific, the memory management circuit 1202 has a plurality of control instructions, and when the memory storage apparatus 1200 is enabled, the control instructions are executed to perform various operations on the memory module 1220, such as data reading, data writing, data erasing, mapping table management, bad block management and so on.

In the third exemplary embodiment, the control instructions of the memory management circuit 1202 are implemented in a firmware form. However, the present invention is not limited thereto and in another exemplary embodiment, the control instructions of the memory management circuit 1202 may be implemented in a hardware form or as program codes.

In the third exemplary embodiment, when the memory management circuit 1202 reads data from the memory module 1220 and the ECC circuit 608 can not successfully perform the ECC procedure on the read data, the memory management circuit 1202 gives a soft-information estimated value request command corresponding to the memory cells stored the read data to the memory module 1220. And, the soft value extracting circuit 1254 reads soft values in response to the soft-information estimated value request command and calculates and provides soft-information estimated values to the memory management circuit 1202. Then, the memory management circuit 1202 provides the received soft-information estimated values to the ECC circuit 608, and the ECC circuit 608 performs the ECC procedure on the read data again based on the soft-information estimated values to correct error bits occurred in the read data.

Fourth Exemplary Embodiment

A memory storage apparatus of a fourth exemplary embodiment is substantially the same as the memory storage apparatus of the third exemplary embodiment, and the memory storage apparatus of the fourth exemplary embodiment is described as the following with FIG. 12.

In the fourth exemplary embodiment, data reading and data writing are the same as that of the third exemplary embodiment and the soft value extracting circuit 1254 obtains soft values and calculates soft-information estimated values according to the manners described in the third exemplary embodiment. Only differences between the fourth exemplary embodiment and the third exemplary embodiment are described in the following.

In the fourth exemplary embodiment, the soft value extracting circuit 1254 is configured for obtaining extended soft values from the memory cells corresponding to the read data and calculates extended soft-information estimated values corresponding to the read data.

For example, when the control circuit 1212 receives an extended soft-information estimated value request command corresponding to lower page data of several memory cells of the memory module 1220 from the memory controller 1230, the soft value extracting circuit 1254 sets a second extended minus-adjustment-bit-data-read voltage VBME and a second extended plus-adjustment-bit-data-read voltage VBPE corresponding to the second-bit-data-read voltage VB and instructs the word line control circuit 204 to apply the second extended minus-adjustment-bit-data-read voltage VBME and the second extended plus-adjustment-bit-data-read voltage VBPE to these memory cell, such that the control gates of these memory cells output corresponding extended soft values (as shown in FIG. 10). Moreover, the soft value extracting circuit 1254 calculates extended soft-information estimated values of the lower page data according to the formula (15-1) and these extended soft-information estimated values are transmitted to the memory controller 1230 via the data input/output buffer 210.

Similarly, when the control circuit 1212 receives an extended soft-information estimated value request command corresponding to upper page data of several memory cells of the memory module 1220 from the memory controller 1230, the soft value extracting circuit 1254 sets a third extended minus-adjustment-bit-data-read voltage VCME and a third extended plus-adjustment-bit-data-read voltage VCPE corresponding to the third-bit-data-read voltage VC and a first extended minus-adjustment-bit-data-read voltage VAME and a first extended plus-adjustment-bit-data-read voltage VAPE corresponding to the first-bit-data-read voltage VA; and instructs the word line control circuit 204 to apply the third extended minus-adjustment-bit-data-read voltage VCME, the third extended plus-adjustment-bit-data-read voltage VCPE, the first extended minus-adjustment-bit-data-read voltage VAME and the first extended plus-adjustment-bit-data-read voltage VAPE to these memory cell, such that the control gates of these memory cells output corresponding extended soft values. Moreover, The soft value extracting circuit 1254 calculates extended soft-information estimated values of the upper page data according to the formulas (15-2), (16) and (17) and these extended soft-information estimated values are transmitted to the memory controller 1230 via the data input/output buffer 210.

In the fourth exemplary embodiment, the soft value extracting circuit 1254 sets the first extended minus-adjustment-bit-data-read voltage VAME, the first extended plus-adjustment-bit-data-read voltage VAPE, the second extended minus-adjustment-bit-data-read voltage VBME, the second extended plus-adjustment-bit-data-read voltage VBPE, the third extended minus-adjustment-bit-data-read voltage VCME, and the third extended plus-adjustment-bit-data-read voltage VCPE according to the formulas (18)~(23). It should be noted that the formulas (18)~(23) are examples for setting the extended minus-adjustment-bit-data-read voltages and extended plus-adjustment-bit-data-read voltages, and the soft value extracting circuit 1254 is not limited thereto.

In the fourth exemplary embodiment, when the memory management circuit 1202 reads data from the memory module 1220 and the ECC circuit 608 can not successfully perform the ECC procedure on the read data with the soft-information estimated value, the memory management circuit 1202 gives an extended soft-information estimated value request command corresponding to the memory cells stored the read data to the memory module 1220. And, the soft value extracting circuit 1254 reads extended soft values in response to the extended soft-information estimated value request command, and thus calculates and provides extended soft-information estimated values to the memory management circuit 1202. Then, the memory management circuit 1202 provides these extended soft-information estimated values to the ECC circuit 608, and the ECC circuit 608 performs the ECC procedure on the read data again based on the soft-information estimated values and the extended soft-information estimated values to correct error bits occurred in the read data.

In summary, the data reading method according to the foregoing exemplary embodiments can effectively obtain soft-information estimated values corresponding to the memory cells, thereby increasing the capability of correcting error bits. The previously described exemplary embodiments of the present invention have the advantages aforementioned, wherein the advantages aforementioned not required in all versions of the invention.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A data reading method, for a flash memory module, the data reading method comprising:

applying at least one bit-data-read voltage to get read data from a plurality of memory cells of the flash memory module, wherein the read data has a plurality of bits;

setting at least one minus-adjustment-bit-data-read voltage and at least one plus-adjustment-bit-data-read voltage corresponding to the at least one bit-data-read voltage according to at least one error-distribution estimated value, wherein the at least one minus-adjustment-bit-data-read voltage is smaller than the at least bit-data-read voltage and the at least one plus-adjustment-bit-data-read voltage is larger than the at least one bit-data-read voltage;

applying the at least one minus-adjustment-bit-data-read voltage and the at least one plus-adjustment-bit-data-read voltage to obtain a plurality of soft values corresponding to the read data from the memory cells; and calculating a soft-information estimated value corresponding to each of the bits of the read data according to the soft values, wherein the soft-information estimated values are used for correcting error bits of the read data.

2. The data reading method according to claim 1, wherein the at least one bit-data-read voltage includes a first-bit-data-read voltage, a second-bit-data-read voltage and a third-bit-data-read voltage, wherein the step of setting the at least one minus-adjustment-bit-data-read voltage and the at least one plus-adjustment-bit-data-read voltage corresponding to the at least one bit-data-read voltage according to the at least one error-distribution estimated value comprises:

setting a first minus-adjustment-bit-data-read voltage and a first plus-adjustment-bit-data-read voltage corresponding to the first-bit-data-read voltage and a second minus-adjustment-bit-data-read voltage corresponding to the second-bit-data-read voltage according to a first adjustment value;

setting a second plus-adjustment-bit-data-read voltage corresponding to the second-bit-data-read voltage, and a third minus-adjustment-bit-data-read voltage and a third plus-adjustment-bit-data-read voltage corresponding to the third-bit-data-read voltage according to a second adjustment value, wherein the first adjustment value and the second adjustment value are set according to the at least one error-distribution estimated value.

3. The data reading method according to claim 2, wherein the step of applying the at least one minus-adjustment-bit-data-read voltage and the at least one plus-adjustment-bit-data-read voltage to obtain the soft values corresponding to the read data from the memory cells comprises:

applying the first plus-adjustment-bit-data-read voltage, the first minus-adjustment-bit-data-read voltage, the second plus-adjustment-bit-data-read voltage, the second minus-adjustment-bit-data-read voltage, the third plus-adjustment-bit-data-read voltage and the third minus-adjustment-bit-data-read voltage to obtain the soft values corresponding to the read data from the memory cells.

4. The data reading method according to claim 1, further comprising:

executing an error checking and correcting procedure on the read data according to the soft-information estimated values; and outputting a corrected read data corresponding to the read data.

5. The data accessing method according to claim 1, wherein the step of calculating the soft-information estimated value corresponding to each of the bits of the read data according to the soft values comprises:

orderly executing a XOR operation according to each of the soft values corresponding to the read data to generate the soft-information estimated value corresponding to each of the bits of the read data.

6. The data reading method according to claim 2, wherein the first minus-adjustment-bit-data-read voltage, the first plus-adjustment-bit-data-read voltage, the second minus-adjustment-bit-data-read voltage, the second plus-adjustment-bit-data-read voltage, the third minus-adjustment-bit-data-read voltage and the third plus-adjustment-bit-data-read voltage are respectively set according to formulas (7), (8), (9), (10), (11) and (12):

$$VAM=VA-FAV \tag{7}$$

$$VAP=VA+FAV \tag{8}$$

$$VBM=VB-FAV \tag{9}$$

$$VBP=VB+SAV \tag{10}$$

$$VCM=VC-SAV \tag{11}$$

$$VCP=VC+SAV \tag{12}$$

wherein VAM represents the first minus-adjustment-bit-data-read voltage, VAP represents the first plus-adjustment-bit-data-read voltage, VBM represents the second minus-adjustment-bit-data-read voltage, VBP represents the second plus-adjustment-bit-data-read voltage, VCM represents the third minus-adjustment-bit-data-read voltage, VCP represents the third plus-adjustment-bit-data-read voltage, FAV represents the first adjustment value, SAV represent the second adjustment value, VA represents the first-bit-data-read voltage, VB represents the second-bit-data-read voltage, and VC represents the third-bit-data-read voltage, wherein the first adjustment value and the second adjustment value are set according to formulas (13) and (14):

$$FAV=(VB-VA)/N \tag{13}$$

$$SAV=(VC-VB)/M \tag{14}$$

wherein N and M are the error-distribution estimated values.

7. The data reading method according to claim 1, further comprising:

adjusting the at least one error-distribution estimated value according to the number of erasing or a data error rate of the flash memory module.

8. The data reading method according to claim 1, further comprising:

setting at least one extended minus-adjustment-bit-data-read voltage and at least one extended plus-adjustment-bit-data-read voltage corresponding to the at least one bit-data-read voltage according to the at least one error-distribution estimated value;

applying the at least one extended minus-adjustment-bit-data-read voltage and the at least one extended plus-adjustment-bit-data-read voltage to obtain a plurality of extended soft values corresponding to the read data from the memory cells; and calculating an extended soft-information estimated value corresponding to each of the bits of the read data according to the extended soft values.

9. The data reading method according to claim 8, wherein the at least one bit-data-read voltage includes a first-bit-data-read voltage, a second-bit-data-read voltage and a third-bit-data-read voltage, wherein the step of setting the at least one extended minus-adjustment-bit-data-read voltage and the at least one extended plus-adjustment-bit-data-read voltage corresponding to the at least one bit-data-read voltage according to the at least one error-distribution estimated value comprises:

setting a first extended minus-adjustment-bit-data-read voltage and a first extended plus-adjustment-bit-data-read voltage corresponding to the first-bit-data-read voltage and a second extended minus-adjustment-bit-data-read voltage corresponding to the second-bit-data-read voltage according to a first adjustment value;

setting a second extended plus-adjustment-bit-data-read voltage corresponding to the second-bit-data-read voltage, and a third extended minus-adjustment-bitdata-read voltage and a third extended plus-adjustment-bit-data-read voltage corresponding to the third-bit-data-read voltage according to a second adjustment value,
wherein the first adjustment value and the second adjustment value are set according to the at least one error-distribution estimated value.

10. The data reading method according to claim 9, wherein the step of applying the at least one extended minus-adjustment-bit-data-read voltage and the at least one extended plus-adjustment-bit-data-read voltage to obtain the extended soft values corresponding to the read data from the memory cells comprises:
applying the first extended plus-adjustment-bit-data-read voltage, the first extended minus-adjustment-bit-data-read voltage, the second extended plus-adjustment-bit-data-read voltage, the second extended minus-adjustment-bit-data-read voltage, the third extended plus-adjustment-bit-data-read voltage and the third extended minus-adjustment-bit-data-read voltage to obtain the extended soft values corresponding to the read data from the memory cells.

11. The data reading method according to claim 8, further comprising:
executing an error checking and correcting procedure on the read data according to the soft-information estimated values and the extended soft-information estimated values; and
outputting a corrected read data corresponding to the read data.

12. The data accessing method according to claim 8, wherein the step of calculating the extended soft-information estimated value corresponding to each of the bits of the read data according to the extended soft values comprises:
orderly executing a XOR operation according to each of the extended soft values corresponding to the read data to generate the extended soft-information estimated value corresponding to each of the bits of the read data.

13. The data reading method according to claim 9, wherein the first minus-adjustment-bit-data-read voltage, the first plus-adjustment-bit-data-read voltage, the second minus-adjustment-bit-data-read voltage, the second plus-adjustment-bit-data-read voltage, the third minus-adjustment-bit-data-read voltage, the third plus-adjustment-bit-data-read voltage, the first extended minus-adjustment-bit-data-read voltage, the first extended plus-adjustment-bit-data-read voltage, the second extended minus-adjustment-bit-data-read voltage, the second extended plus-adjustment-bit-data-read voltage, the third extended minus-adjustment-bit-data-read voltage and the third extended plus-adjustment-bit-data-read voltage are respectively set according to formulas (7), (8), (9), (10), (11), (12), (18), (19), (20), (21), (22) and (23):

$$VAM = VA - FAV \tag{7}$$

$$VAP = VA + FAV \tag{8}$$

$$VBM = VB - FAV \tag{9}$$

$$VBP = VB + SAV \tag{10}$$

$$VCM = VC - SAV \tag{11}$$

$$VCP = VC + SAV \tag{12}$$

$$VAME = VA - C1 \times FAV \tag{18}$$

$$VAPE = VA + C1 \times FAV \tag{19}$$

$$VBME = VB - C1 \times FAV \tag{20}$$

$$VBPE = VB + C2 \times SAV \tag{21}$$

$$VCME = VC - C2 \times SAV \tag{22}$$

$$VCPE = VC + C2 \times SAV \tag{23}$$

wherein VAM represents the first minus-adjustment-bit-data-read voltage, VAP represents the first plus-adjustment-bit-data-read voltage, VBM represents the second minus-adjustment-bit-data-read voltage, VBP represents the second plus-adjustment-bit-data-read voltage, VCM represents the third minus-adjustment-bit-data-read voltage, VCP represents the third plus-adjustment-bit-data-read voltage, FAV represents the first adjustment value, SAV represent the second adjustment value, VA represents the first-bit-data-read voltage, VB represents the second-bit-data-read voltage, VC represents the third-bit-data-read voltage, VAME represents the first extended minus-adjustment-bit-data-read voltage, VAPE represents the first extended plus-adjustment-bit-data-read voltage, VBME represents the second extended minus-adjustment-bit-data-read voltage, VBPE represents the second extended plus-adjustment-bit-data-read voltage, VCME represents the third extended minus-adjustment-bit-data-read voltage and VCPE represents the third extended plus-adjustment-bit-data-read voltage,
wherein the first adjustment value and the second adjustment value are set according to formulas (13) and (14):

$$FAV = (VB - VA)/N \tag{13}$$

$$SAV = (VC - VB)/M \tag{14}$$

wherein N and M are the error-distribution estimated values.

14. A control circuit, comprising:
a memory unit, configured to record at least one bit-data-read voltage; and
a soft value extracting circuit, coupled to the memory unit and configured to:
applying the at least one bit-data-read voltage to get read data from a plurality of memory cells, wherein the read data has a plurality of bits;
setting at least one minus-adjustment-bit-data-read voltage and at least one plus-adjustment-bit-data-read voltage corresponding to the at least one bit-data-read voltage according to at least one error-distribution estimated value;
applying the at least one minus-adjustment-bit-data-read voltage and the at least one plus-adjustment-bit-data-read voltage to obtain a plurality of soft values corresponding to the read data from the memory cells; and
calculating a soft-information estimated value corresponding to each of the bits of the read data according to the soft values.

15. The control circuit according to claim 14, wherein the at least one bit-data-read voltage includes a first-bit-data-read voltage, a second-bit-data-read voltage and a third-bit-data-read voltage,
wherein the step of setting the at least one minus-adjustment-bit-data-read voltage and the at least one plus-adjustment-bit-data-read voltage corresponding to the at least one bit-data-read voltage according to the at least one error-distribution estimated value by the soft value extracting circuit comprises:

setting a first minus-adjustment-bit-data-read voltage and a first plus-adjustment-bit-data-read voltage corresponding to the first-bit-data-read voltage and a second minus-adjustment-bit-data-read voltage corresponding to the second-bit-data-read voltage according to a first adjustment value;

setting a second plus-adjustment-bit-data-read voltage corresponding to the second-bit-data-read voltage, and a third minus-adjustment-bit-data-read voltage and a third plus-adjustment-bit-data-read voltage corresponding to the third-bit-data-read voltage according to a second adjustment value, wherein the first adjustment value and the second adjustment value are set according to the at least one error-distribution estimated value.

16. The control circuit according to claim 15, wherein the step of applying the at least one minus-adjustment-bit-data-read voltage and the at least one plus-adjustment-bit-data-read voltage to obtain the soft values corresponding to the read data from the memory cells by the soft value extracting circuit comprises:

applying the first plus-adjustment-bit-data-read voltage, the first minus-adjustment-bit-data-read voltage, the second plus-adjustment-bit-data-read voltage, the second minus-adjustment-bit-data-read voltage, the third plus-adjustment-bit-data-read voltage and the third minus-adjustment-bit-data-read voltage to obtain the soft values corresponding to each of the bits of the read data from the memory cells.

17. The control circuit according to claim 14, wherein the step of calculating the soft-information estimated value corresponding to each of the bits of the read data according to the soft values by the soft value extracting circuit comprises:

orderly executing a XOR operation according to each of the soft values corresponding to the read data to generate the soft-information estimated value corresponding to each of the bits of the read data.

18. The control circuit according to claim 15, wherein the first minus-adjustment-bit-data-read voltage, the first plus-adjustment-bit-data-read voltage, the second minus-adjustment-bit-data-read voltage, the second plus-adjustment-bit-data-read voltage, the third minus-adjustment-bit-data-read voltage and the third plus-adjustment-bit-data-read voltage are respectively set according to formulas (7), (8), (9), (10), (11) and (12):

$$VAM=VA-FAV \tag{7}$$

$$VAP=VA+FAV \tag{8}$$

$$VBM=VB-FAV \tag{9}$$

$$VBP=VB+SAV \tag{10}$$

$$VCM=VC-SAV \tag{11}$$

$$VCP=VC+SAV \tag{12}$$

wherein VAM represents the first minus-adjustment-bit-data-read voltage, VAP represents the first plus-adjustment-bit-data-read voltage, VBM represents the second minus-adjustment-bit-data-read voltage, VBP represents the second plus-adjustment-bit-data-read voltage, VCM represents the third minus-adjustment-bit-data-read voltage, VCP represents the third plus-adjustment-bit-data-read voltage, FAV represents the first adjustment value, SAV represent the second adjustment value, VA represents the first-bit-data-read voltage, VB represents the second-bit-data-read voltage, and VC represents the third-bit-data-read voltage, wherein the first adjustment value and the second adjustment value are set according to formulas (13) and (14):

$$FAV=(VB-VA)/N \tag{13}$$

$$SAV=(VC-VB)/M \tag{14}$$

wherein N and M are the error-distribution estimated values.

19. The control circuit according to claim 14, wherein the soft value extracting circuit is further configured to adjust the at least one error-distribution estimated values according to the number of erasing or a data error rate of the memory cells.

20. The control circuit according to claim 14, wherein the soft value extracting circuit is further configured to:

setting at least one extended minus-adjustment-bit-data-read voltage and at least one extended plus-adjustment-bit-data-read voltage corresponding to the at least one bit-data-read voltage according to the at least one error-distribution estimated value;

applying the at least one extended minus-adjustment-bit-data-read voltage and the at least one extended plus-adjustment-bit-data-read voltage to obtain a plurality of extended soft values corresponding to the read data from the memory cells; and calculating an extended soft-information estimated value corresponding to each of the bits of the read data according to the extended soft values.

21. The control circuit according to claim 20, wherein the at least one bit-data-read voltage includes a first-bit-data-read voltage, a second-bit-data-read voltage and a third-bit-data-read voltage, wherein the step of setting the at least one extended minus-adjustment-bit-data-read voltage and the at least one extended plus-adjustment-bit-data-read voltage corresponding to the at least one bit-data-read voltage according to the at least one error-distribution estimated value by the soft value extracting circuit comprises:

setting a first extended minus-adjustment-bit-data-read voltage and a first extended plus-adjustment-bit-data-read voltage corresponding to the first-bit-data-read voltage and a second extended minus-adjustment-bit-data-read voltage corresponding to the second-bit-data-read voltage according to a first adjustment value; and setting a second extended plus-adjustment-bit-data-read voltage corresponding to the second-bit-data-read voltage, and a third extended minus-adjustment-bit-data-read voltage and a third extended plus-adjustment-bit-data-read voltage corresponding to the third-bit-data-read voltage according to a second adjustment value, wherein the first adjustment value and the second adjustment value are set according to the at least one error-distribution estimated value.

22. The control circuit according to claim 21, wherein the step of applying the at least one extended minus-adjustment-bit-data-read voltage and the at least one extended plus-adjustment-bit-data-read voltage to obtain the extended soft values corresponding to the read data from the memory cells by the soft value extracting circuit comprises:

applying the first extended plus-adjustment-bit-data-read voltage, the first extended minus-adjustment-bit-data-read voltage, the second extended plus-adjustment-bit-data-read voltage, the second extended minus-adjustment-bit-data-read voltage, the third extended plusadjustment-bit-data-read voltage and the third extended minus-adjustment-bit-data-read voltage to obtain the extended soft values corresponding to each of the bits of the read data from the memory cells.

23. The control circuit according to claim 20, wherein the step of calculating the extended soft-information estimated value corresponding to each of the bits of the read data according to the extended soft values by the soft value extracting circuit comprises:
orderly executing a XOR operation according to each of the extended soft values corresponding to the read data to generate the extended soft-information estimated value corresponding to each of the bits of the read data.

24. The control circuit according to claim 21, wherein the first minus-adjustment-bit-data-read voltage, the first plus-adjustment-bit-data-read voltage, the second minus-adjustment-bit-data-read voltage, the second plus-adjustment-bit-data-read voltage, the third minus-adjustment-bit-data-read voltage, the third plus-adjustment-bit-data-read voltage, the first extended minus-adjustment-bit-data-read voltage, the first extended plus-adjustment-bit-data-read voltage, the second extended minus-adjustment-bit-data-read voltage, the second extended plus-adjustment-bit-data-read voltage, the third extended minus-adjustment-bit-data-read voltage and the third extended plus-adjustment-bit-data-read voltage are respectively set according to formulas (7), (8), (9), (10), (11), (12), (18), (19), (20), (21), (22) and (23):

$$VAM = VA - FAV \tag{7}$$

$$VAP = VA + FAV \tag{8}$$

$$VBM = VB - FAV \tag{9}$$

$$VBP = VB + SAV \tag{10}$$

$$VCM = VC - SAV \tag{11}$$

$$VCP = VC + SAV \tag{12}$$

$$VAME = VA - C1 \times FAV \tag{18}$$

$$VAPE = VA + C1 \times FAV \tag{19}$$

$$VBME = VB - C1 \times FAV \tag{20}$$

$$VBPE = VB + C2 \times SAV \tag{21}$$

$$VCME = VC - C2 \times SAV \tag{22}$$

$$VCPE = VC + C2 \times SAV \tag{23}$$

wherein VAM represents the first minus-adjustment-bit-data-read voltage, VAP represents the first plus-adjustment-bit-data-read voltage, VBM represents the second minus-adjustment-bit-data-read voltage, VBP represents the second plus-adjustment-bit-data-read voltage, VCM represents the third minus-adjustment-bit-data-read voltage, VCP represents the third plus-adjustment-bit-data-read voltage, FAV represents the first adjustment value, SAV represent the second adjustment value, VA represents the first-bit-data-read voltage, VB represents the second-bit-data-read voltage, VC represents the third-bit-data-read voltage, VAME represents the first extended minus-adjustment-bit-data-read voltage, VAPE represents the first extended plus-adjustment-bit-data-read voltage, VBME represents the second extended minus-adjustment-bit-data-read voltage, VBPE represents the second extended plus-adjustment-bit-data-read voltage, VCME represents the third extended minus-adjustment-bit-data-read voltage and VCPE represents the third extended plus-adjustment-bit-data-read voltage,
wherein the first adjustment value and the second adjustment value are set according to formulas (13) and (14):

$$FAV = (VB - VA)/N \tag{13}$$

$$SAV = (VC - VB)/M \tag{14}$$

wherein N and M are the error-distribution estimated values.

25. A memory controller, comprising:
a memory interface, configured to couple to a flash memory module;
a host interface, configured to couple to a host system;
a memory management circuit, configured to receive a read command from the host system and obtain read data corresponding to the read command from a plurality of memory cells of the flash memory module via the memory interface, wherein the read data has a plurality of bits and the memory management circuit comprises:
a memory unit, configured to record at least one bit-data-read voltage; and
a soft value extracting circuit, coupled to the memory unit and configured to:
setting at least one minus-adjustment-bit-data-read voltage and at least one plus-adjustment-bit-data-read voltage corresponding to the at least one bit-data-read voltage according to at least one error-distribution estimated value;
giving a soft-information estimated value request command to the flash memory module to instruct the flash memory module to apply the at least one minus-adjustment-bit-data-read voltage and the at least one plus-adjustment-bit-data-read voltage to obtain a plurality of soft values corresponding to the read data from the memory cells; and
calculating a soft-information estimated value corresponding to each of the bits of the read data according to the soft values.

* * * * *